US009841672B2

(12) United States Patent
Kang et al.

(10) Patent No.: US 9,841,672 B2
(45) Date of Patent: Dec. 12, 2017

(54) METHOD OF DECOMPOSING LAYOUT OF SEMICONDUCTOR DEVICE FOR QUADRUPLE PATTERNING TECHNOLOGY PROCESS AND METHOD OF MANUFACTURING SEMICONDUCTOR DEVICE USING THE SAME

(71) Applicant: SAMSUNG ELECTRONICS CO., LTD., Suwon-si, Gyeonggi-Do (KR)

(72) Inventors: Dae-Kwon Kang, Yongin-si (KR); Jae-Seok Yang, Hwaseong-si (KR); Sung-Wook Hwang, Gyeongsangbuk-Do (KR); Dong-Gyun Kim, Seoul (KR); Ji-Young Jung, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 227 days.

(21) Appl. No.: 14/690,073

(22) Filed: Apr. 17, 2015

(65) Prior Publication Data

US 2016/0070848 A1 Mar. 10, 2016

(30) Foreign Application Priority Data

Sep. 4, 2014 (KR) .................. 10-2014-0117752

(51) Int. Cl.
  *G06F 17/50* (2006.01)
  *G03F 1/70* (2012.01)
  *G03F 7/20* (2006.01)

(52) U.S. Cl.
  CPC ............ *G03F 1/70* (2013.01); *G03F 7/70433* (2013.01); *G03F 7/70466* (2013.01)

(58) Field of Classification Search
  USPC .......................................... 716/52
  See application file for complete search history.

(56) References Cited

U.S. PATENT DOCUMENTS

| 7,894,041 B2 | 2/2011 | Bleeker |
| 7,927,773 B2 | 4/2011 | Hakko |
| 8,402,407 B2 | 3/2013 | Nojima |

(Continued)

FOREIGN PATENT DOCUMENTS

| JP | 2005-300999 | 10/2005 |
| JP | 2007-052531 | 1/2007 |

*Primary Examiner* — Bryce Aisaka
(74) *Attorney, Agent, or Firm* — F. Chau & Associates, LLC

(57) ABSTRACT

A method of decomposing a layout of a semiconductor device for a quadruple patterning technology (QPT) process includes dividing the layout of the semiconductor device into a first temporary pattern, which includes rectangular features having a rectangular shape, and a second temporary pattern, which includes cross couple features having a Z-shape, generating a third temporary pattern and a fourth temporary pattern by performing a pattern dividing operation on the first temporary pattern in a first direction, generating a first target pattern and a second target pattern by incorporating each of the cross couple features included in the second temporary pattern into one of the third temporary pattern and the fourth temporary pattern, and generating first through fourth decomposed patterns by performing the pattern dividing operation on the first target pattern and the second target pattern in a second direction.

18 Claims, 26 Drawing Sheets

(56) References Cited

U.S. PATENT DOCUMENTS

| | | |
|---|---|---|
| 8,415,077 B2 | 4/2013 | Agarwal et al. |
| 8,644,589 B2 | 2/2014 | Hsu et al. |
| 8,689,150 B2 | 4/2014 | Jung et al. |
| 9,026,971 B1 * | 5/2015 | Ho .................. G06F 17/5081 716/112 |
| 2010/0296069 A1 | 11/2010 | Matsuura |
| 2013/0061185 A1 * | 3/2013 | Abou Ghaida ........... G03F 1/70 716/55 |
| 2013/0086536 A1 | 4/2013 | Kim et al. |

* cited by examiner

METHOD OF DECOMPOSING LAYOUT OF SEMICONDUCTOR DEVICE FOR QUADRUPLE PATTERNING TECHNOLOGY PROCESS AND METHOD OF MANUFACTURING SEMICONDUCTOR DEVICE USING THE SAME

CROSS-REFERENCE TO RELATED APPLICATION(S)

This application claims priority under 35 USC §119 from Korean Patent Application No. 10-2014-0117752, filed on Sep. 4, 2014 in the Korean Intellectual Property Office (KIPO), and all the benefits accruing therefrom, the contents of which are herein incorporated by reference in their entirety.

BACKGROUND

1. Technical Field

Exemplary embodiments are directed to a method of manufacturing a semiconductor device, and more particularly to a method of decomposing a layout of a semiconductor device for a quadruple patterning technology (QPT) process.

2. Discussion of the Related Art

In manufacturing a high density semiconductor device, a double patterning technology (DPT) process is generally used to avoid conflicts between patterns included in a layout of the semiconductor device. In a DPT process, a layout of a semiconductor device is decomposed into two patterns, and a wiring pattern is formed on a substrate by performing a lithography process on the substrate twice using the two patterns. A double pattern decomposition tool, which decomposes a layout of a semiconductor device into two patterns using a double pattern dividing algorithm, is generally used for a DPT process.

However, as a density of a semiconductor device further increases, it becomes challenging to meet a design rule using a DPT process. For this reason, a quadruple patterning technology (QPT) process, in which a layout of a semiconductor device is decomposed into four patterns, and four lithography processes are performed on the substrate using the four patterns to form the wiring pattern, has been developed.

However, it takes more time to decompose a layout of a semiconductor device into four patterns for a QPT process.

SUMMARY

Some exemplary embodiments can provide a method of decomposing a layout of a semiconductor device for a quadruple patterning technology (QPT) process using a double pattern dividing algorithm for a double patterning technology (DPT) process.

Some exemplary embodiments can provide a method of manufacturing a semiconductor device using the method of decomposing a layout of a semiconductor device for the QPT process.

In a method of decomposing a layout of a semiconductor device for a quadruple patterning technology (QPT) process, the layout of the semiconductor device is divided into a first temporary pattern, which includes rectangular features, and a second temporary pattern, which includes cross couple features, a third temporary pattern and a fourth temporary pattern are generated by performing a pattern dividing operation on the first temporary pattern in a first direction, a first target pattern and a second target pattern are generated by incorporating each of the cross couple features included in the second temporary pattern into one of the third temporary pattern and the fourth temporary pattern, and first through fourth decomposed patterns are generated by performing the pattern dividing operation on the first target pattern and the second target pattern in a second direction.

In exemplary embodiments, the second direction may be perpendicular to the first direction.

In exemplary embodiments, the rectangular features may have a rectangular shape, and the cross couple features may have a Z-shape.

In exemplary embodiments, each end of the cross couple features may be within a critical dimension of at least two of the rectangular features.

In exemplary embodiments, the pattern dividing operation may be a double pattern dividing algorithm for a double patterning technology (DPT) process.

In exemplary embodiments, generating the first target pattern and the second target pattern may further include generating a third target pattern by incorporating the cross couple features included in the second temporary pattern into the third temporary pattern, generating a fifth temporary pattern and a sixth temporary pattern by performing the pattern dividing operation on the third target pattern in the second direction, and determining whether a pattern conflict occurs in the fifth temporary pattern and the sixth temporary pattern.

In exemplary embodiments, the method may further include, when a pattern conflict occurs, identifying conflict cross couple features, which cause a pattern conflict, among the cross couple features included in the fifth temporary pattern and the sixth temporary pattern, generating the first target pattern by eliminating the conflict cross couple features from the third target pattern, and generating the second target pattern by incorporating the conflict cross couple features into the fourth temporary pattern.

Generating the first target pattern and the second target pattern may further include determining the third target pattern and the fourth temporary pattern as the first target pattern and the second target pattern, respectively, when no pattern conflict occurs in the fifth temporary pattern and the sixth temporary pattern.

In exemplary embodiments, generating the first through fourth decomposed patterns may further include generating the first decomposed pattern and the second decomposed pattern by performing the pattern dividing operation on the first target pattern in the second direction, and generating the third decomposed pattern and the fourth decomposed pattern by performing the pattern dividing operation on the second target pattern in the second direction.

Two features among the rectangular features and the cross couple features included in the first target pattern, which are within a critical dimension from each other in the second direction, may be separated into the first decomposed pattern and the second decomposed pattern, and two features among the rectangular features and the cross couple features included in the second target pattern, which are within the critical dimension from each other in the second direction, may be separated into the third decomposed pattern and the fourth decomposed pattern.

In exemplary embodiments, two rectangular features among the rectangular features included in the first temporary pattern, which are within a critical dimension from each other in the first direction, may be separated into the third temporary pattern and the fourth temporary pattern.

In exemplary embodiments, the first through fourth decomposed patterns may be displayed with differing first through fourth colors, respectively.

In exemplary embodiments, the semiconductor device may correspond to a system-on-chip.

In a method of manufacturing a semiconductor device, first through fourth decomposed patterns are generated by performing a pattern dividing operation on a layout of the semiconductor device in a first direction and in a second direction using a double pattern dividing algorithm for a double patterning technology (DPT) process, first through fourth masks corresponding to the first through fourth decomposed patterns, respectively, are generated, and a wiring pattern is formed on a substrate by sequentially patterning the substrate using the first through fourth masks.

In exemplary embodiments, generating the first through fourth decomposed patterns may include dividing the layout of the semiconductor device into a first temporary pattern, which includes rectangular features, and a second temporary pattern, which includes cross couple features, generating a third temporary pattern and a fourth temporary pattern by performing the pattern dividing operation on the first temporary pattern in the first direction, generating a first target pattern and a second target pattern by incorporating each of the cross couple features included in the second temporary pattern into one of the third temporary pattern and the fourth temporary pattern, and generating the first through fourth decomposed patterns by performing the pattern dividing operation on the first target pattern and the second target pattern in the second direction.

Generating the first target pattern and the second target pattern may include generating a third target pattern by incorporating the cross couple features included in the second temporary pattern into the third temporary pattern, generating a fifth temporary pattern and a sixth temporary pattern by performing the pattern dividing operation on the third target pattern in the second direction, determining conflict cross couple features, which cause a pattern conflict, among the cross couple features included in the fifth temporary pattern and the sixth temporary pattern, generating the first target pattern by eliminating the conflict cross couple features from the third target pattern, and generating the second target pattern by incorporating the conflict cross couple features into the fourth temporary pattern, and determining whether a pattern conflict occurs in the fifth temporary pattern and the sixth temporary pattern The method may further include, when a pattern conflict occurs, identifying conflict cross couple features which cause a pattern conflict from among the cross couple features included in the fifth temporary pattern and the sixth temporary pattern, generating the first target pattern by eliminating the conflict cross couple features from the third target pattern, and generating the second target pattern by incorporating the conflict cross couple features into the fourth temporary pattern.

Generating the first through fourth decomposed patterns may further includes generating the first decomposed pattern and the second decomposed pattern by performing the pattern dividing operation on the first target pattern in the second direction, and generating the third decomposed pattern and the fourth decomposed pattern by performing the pattern dividing operation on the second target pattern in the second direction.

According to exemplary embodiments, there is provided a layout decomposition device for a quadruple patterning technology (QPT) process that includes a feature divider, a controller in signal communication with the feature divider, and a pattern decomposition device in signal communication with the controller. The feature divider receives a layout of a semiconductor device, divides the layout of the semiconductor device into a first temporary pattern which includes rectangular features and a second temporary pattern which includes cross couple features, and transmits the first temporary pattern and the second temporary pattern to the controller. The controller and the pattern decomposition device repeat the steps of generating a target pattern, transmits the target pattern and a direction signal to the pattern decomposition device, generating the first result pattern and the second result pattern from the target pattern using the direction signal, and transmits the first result pattern and a second result pattern to the controller, to generate first through fourth decomposed patterns.

The controller may transmit the first temporary pattern and a direction signal representing a first direction to the pattern decomposition device. The pattern decomposition device may generate a first result pattern and a the second result pattern by performing a pattern dividing operation on the first temporary pattern in the first direction, and transmits the first result pattern and the second result pattern to the controller. Performing the pattern dividing operation may include separating two rectangular features in the first temporary pattern that are within a critical dimension of each other in the first direction into the first result pattern and the second result pattern. The controller may generate a first target pattern and a second target pattern based on the second temporary pattern, the first result pattern and the second result pattern by incorporating each of the cross couple features included in the second temporary pattern into one of the first result pattern and the second result pattern, transmits the first target pattern and the direction signal for the second direction to the pattern decomposition device, and transmits the second target pattern and the direction signal for the second direction to the pattern decomposition device. The pattern decomposition device may generate the first through fourth decomposed patterns and by performing a pattern dividing operation on the first target pattern and the second target pattern in the second direction.

DETAILED DESCRIPTION OF THE EMBODIMENTS

Figure 1:
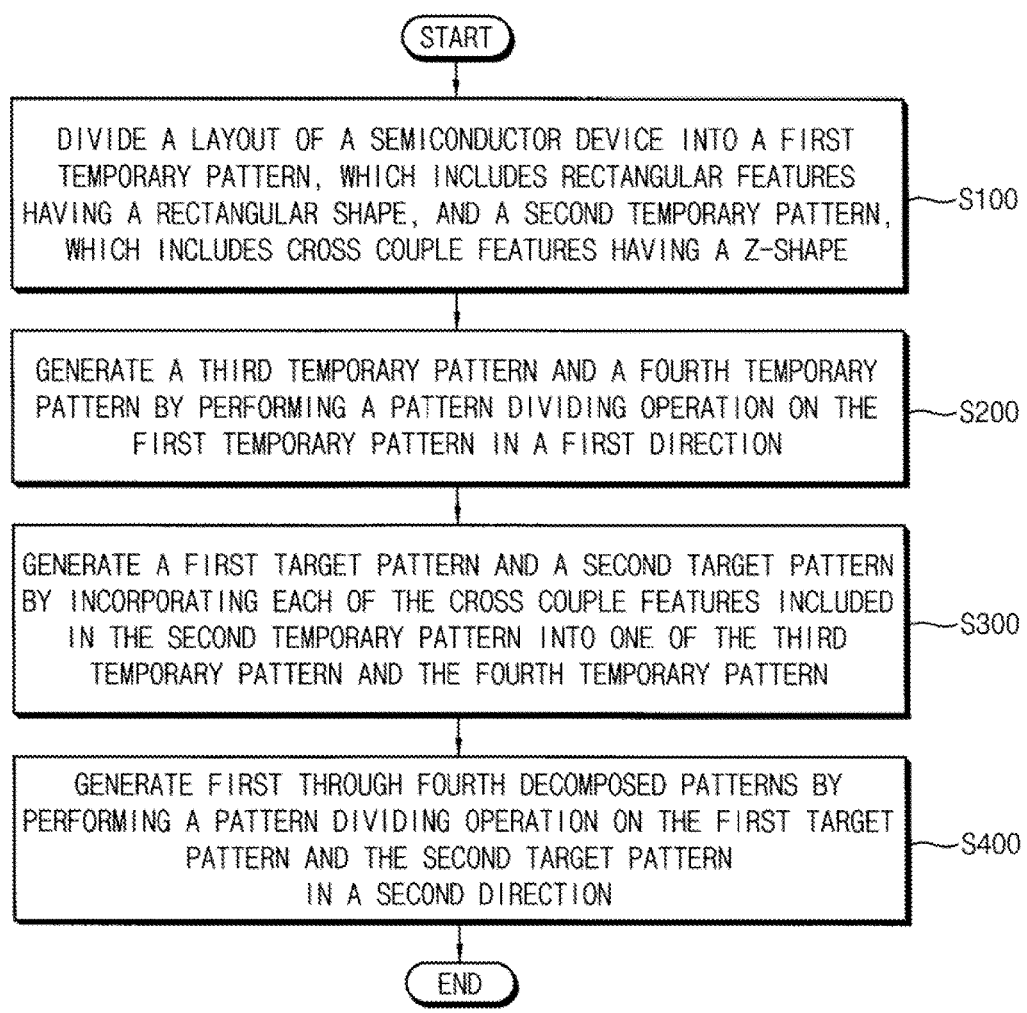
FIG. 1 is a flow chart that illustrates a method of decomposing a layout of a semiconductor device for a quadruple patterning technology (QPT) process according to exemplary embodiments.

Various exemplary embodiments will be described more fully with reference to the accompanying drawings, in which some exemplary embodiments are shown. The present inventive concept may, however, be embodied in many different forms and should not be construed as limited to the embodiments set forth herein. Like reference numerals may refer to like elements throughout this application.

It will be understood that when an element is referred to as being "connected" or "coupled" to another element, it can be directly connected or coupled to the other element or intervening elements may be present.

FIG. 1 is a flow chart that illustrates a method of decomposing a layout of a semiconductor device for a quadruple patterning technology (QPT) process according to exemplary embodiments.

In FIG. 1, a method of decomposing a layout of a semiconductor device, which includes rectangular features having a rectangular shape and cross couple features having a Z-shape, into four decomposed patterns by dividing each of the rectangular features and each of the cross couple features included in the layout into the four decomposed patterns is illustrated.

Referring to FIG. 1, the layout of the semiconductor device is divided into a first temporary pattern, which includes the rectangular features having a rectangular shape, and a second temporary pattern, which includes the cross couple features having a Z-shape (step S100).

After that, a third temporary pattern and a fourth temporary pattern are generated by performing a pattern dividing operation on the first temporary pattern, which includes the rectangular features, in a first direction (step S200).

The first direction may correspond to a width direction of the rectangular features.

In some exemplary embodiments, a pattern dividing operation may be performed using a double pattern dividing algorithm for a double patterning technology (DPT) process. For example, a pattern dividing operation may be performed by a pattern decomposition device used in a DPT process. According to exemplary embodiments, a pattern decomposition device may be implemented as software, hardware, or a combination of software and hardware. In a method of decomposing a layout of a semiconductor device for a QPT process of FIG. 1, a pattern dividing operation may be performed using various types of double pattern dividing algorithms.

A first target pattern and a second target pattern are generated by incorporating each of the cross couple features included in the second temporary pattern into one of the third temporary pattern and the fourth temporary pattern (step S300).

In some exemplary embodiments, some of the cross couple features included in the second temporary pattern may be incorporated into the third temporary pattern and rest of the cross couple features included in the second temporary pattern may be incorporated into the fourth temporary pattern. In other exemplary embodiments, all of the cross couple features included in the second temporary pattern may be incorporated into the third temporary pattern or into the fourth temporary pattern.

After that, first through fourth decomposed patterns are generated by performing a pattern dividing operation on the first target pattern and the second target pattern in a second direction (step S400).

For example, the first decomposed pattern and the second decomposed pattern may be generated by performing a pattern dividing operation on the first target pattern in the second direction, and the third decomposed pattern and the fourth decomposed pattern may be generated by performing a pattern dividing operation on the second target pattern in the second direction.

In some exemplary embodiments, the second direction may be substantially perpendicular to the first direction. For example, the second direction may correspond to a longitudinal direction of the rectangular features.

In some exemplary embodiments, the semiconductor device may correspond to a system-on-chip. For example, the semiconductor device may be a system-on-chip that includes a logic circuit. Therefore, a method of decomposing a layout of a semiconductor device for a QPT process of FIG. 1 may be used in manufacturing a system-on-chip.

As described above, in a method of decomposing a layout of a semiconductor device for a QPT process of FIG. 1, the layout of the semiconductor device may be decomposed into the first through fourth decomposed patterns by performing a pattern dividing operation on the layout in the first direction and in the second direction using a pattern decomposition device used in a DPT process. Since the layout of the semiconductor device is decomposed into the first through fourth decomposed patterns using a double pattern dividing algorithm for a DPT process, a speed of performing the QPT process may be effectively increased.

Figure 2:
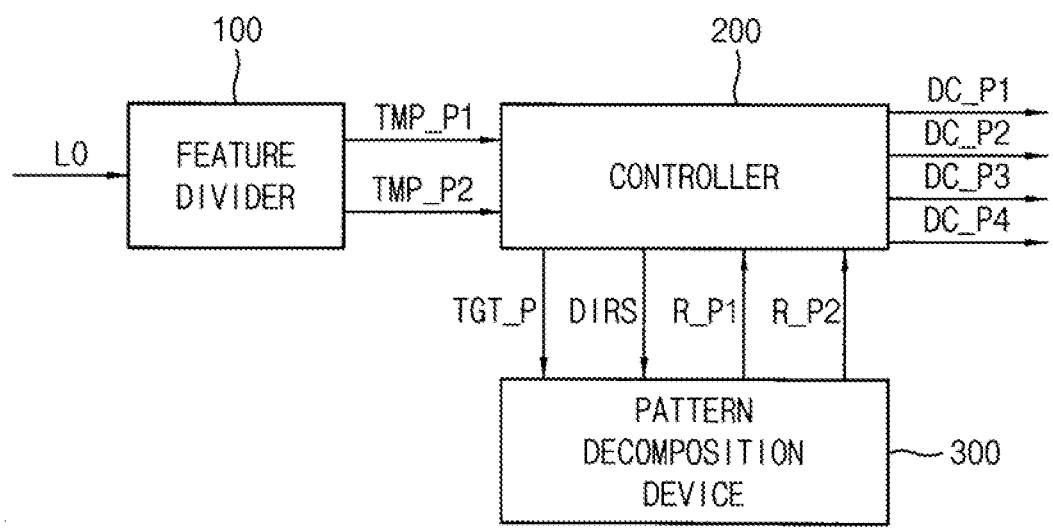
FIG. 2 is a block diagram that illustrates a layout decomposition device for a QPT process according to exemplary embodiments.

FIG. 2 is a block diagram that illustrates a layout decomposition device for a QPT process according to exemplary embodiments.

The method of decomposing a layout of a semiconductor device for a QPT process of FIG. 1 may be performed by a layout decomposition device 10 of FIG. 2.

Hereinafter, the method of decomposing a layout of a semiconductor device for a QPT process performed by the layout decomposition device 10 will be described with reference to FIGS. 1 and 2.

Referring to FIG. 2, the layout decomposition device 10 includes a feature divider 100, a controller 200 and a pattern decomposition device 300.

The feature divider 100 receives a layout LO of a semiconductor device.

Figure 3:
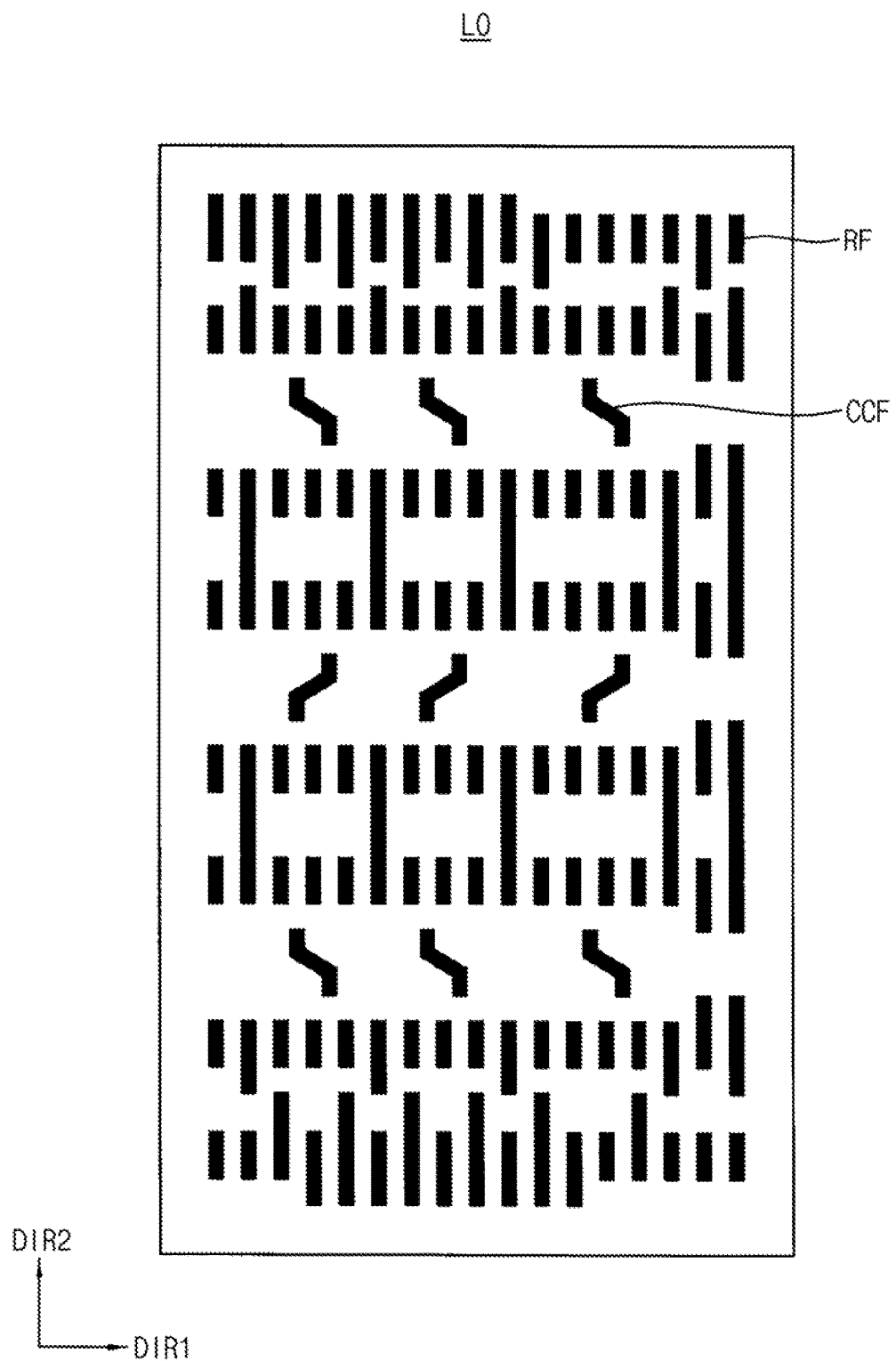
FIG. 3 illustrates an example of a layout of a semiconductor device provided to a layout decomposition device of FIG. 2.

FIG. 3 illustrates an example of a layout of a semiconductor device provided to a layout decomposition device of FIG. 2.

Referring to FIG. 3, the layout LO of the semiconductor device may include rectangular features RF having a rectangular shape and cross couple features CCF having a Z-shape.

Each end of the cross couple features CCF included in the layout LO may be within a critical dimension from at least two of the rectangular features RF.

Figure 4:
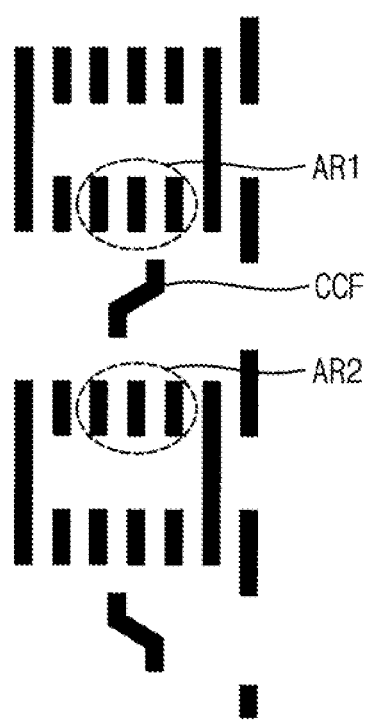
FIG. 4 illustrates a part of the layout of the semiconductor device of FIG. 3.

FIG. 4 illustrates a part of the layout of the semiconductor device of FIG. 3.

As illustrated in FIG. 4, a distance between a first end of the cross couple feature CCF and each of the rectangular features RF included in a first area AR1, which is close to the first end of the cross couple feature CCF, may be less than the critical dimension.

In addition, a distance between a second end of the cross couple feature CCF and each of the rectangular features RF included in a second area AR2, which is close to the second end of the cross couple feature CCF, may be less than the critical dimension.

Referring again to FIG. 3, in the layout LO, a distance between at least two rectangular features RF adjacent in a first direction DIR1, which correspond to a width direction of the rectangular features RF, may be less than the critical dimension.

In addition, in the layout LO, a distance between at least two rectangular features RF adjacent in a second direction DIR2, which correspond to a longitudinal direction of the rectangular features RF, may be less than the critical dimension.

Referring again to FIG. 2, the feature divider 100 may divide the layout LO of the semiconductor device into a first temporary pattern TMP_P1, which includes the rectangular features RF, and a second temporary pattern TMP_P2, which includes the cross couple features CCF (step S100).

Figure 5:
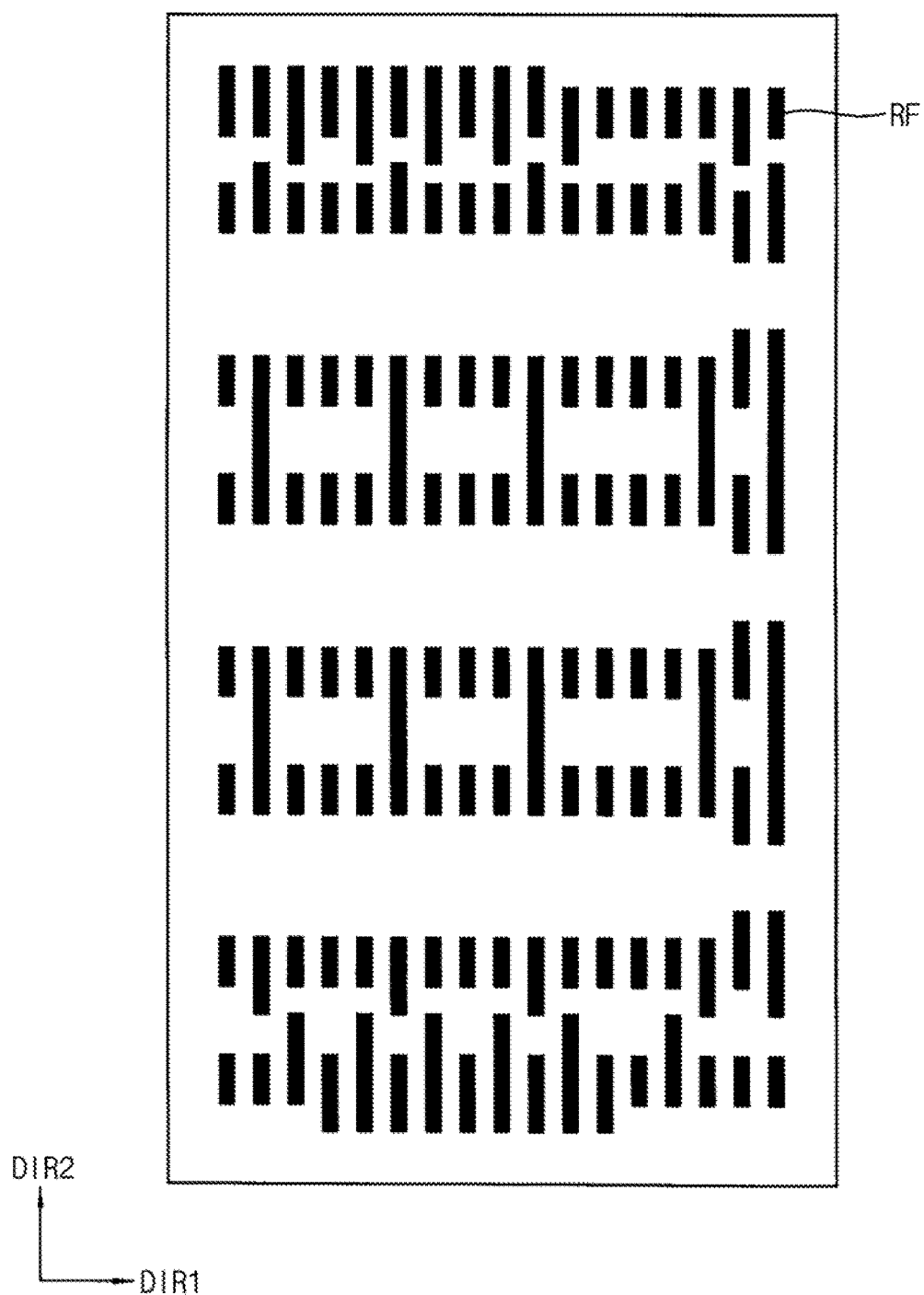
FIG. 5 illustrates an example of a first temporary pattern generated by dividing a layout of a semiconductor device of FIG. 3.
Figure 6:
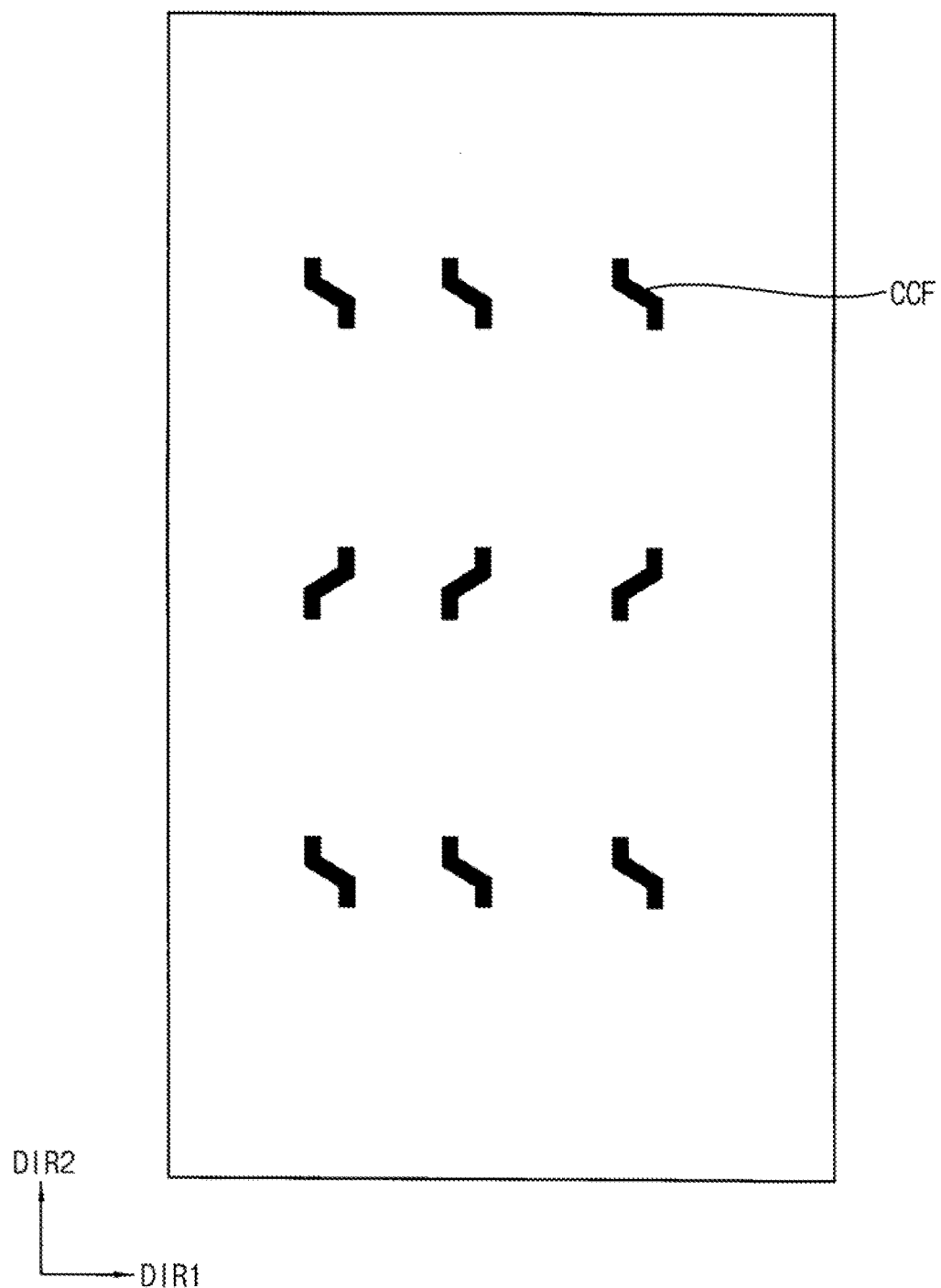
FIG. 6 illustrates an example of a second temporary pattern generated by dividing a layout of a semiconductor device of FIG. 3.

FIG. 5 illustrates an example of a first temporary pattern generated by dividing a layout of a semiconductor device of FIG. 3. FIG. 6 illustrates an example of a second temporary pattern generated by dividing a layout of a semiconductor device of FIG. 3.

As illustrated in FIGS. 3 and 5, the feature divider 100 may generate the first temporary pattern TMP_P1 that includes the rectangular features RF by eliminating the cross couple features CCF from the layout LO.

As illustrated in FIGS. 3 and 6, the feature divider 100 may generate the second temporary pattern TMP_P2 that includes the cross couple features CCF by eliminating the rectangular features RF from the layout LO.

Referring again to FIG. 2, the pattern decomposition device 300 receives a target pattern TGT_P and a direction signal DIRS from the controller 200. The pattern decomposition device 300 may generate a first result pattern R_P1 and a second result pattern R_P2 by performing a pattern dividing operation on the target pattern TGT_P in a direction corresponding to the direction signal DIRS. The direction signal DIRS may represent one of the first direction DIRT or the second direction DIR2.

In some exemplary embodiments, the pattern decomposition device 300 may perform pattern dividing operation using various double pattern dividing algorithms used in a DPT process. For example, the pattern decomposition device 300 may separate two features in the target pattern TGT_P within the critical dimension of each other in a direction corresponding to the direction signal DIRS into the first result pattern R_P1 and the second result pattern R_P2.

The controller 200 receives the first temporary pattern TMP_P1 and the second temporary pattern TMP_P2 from the feature divider 100. The controller 200 may generate the target pattern TGT_P based on the first temporary pattern TMP_P1, transmit the target pattern TGT_P and the direction signal DIRS to the pattern decomposition device 300, and receive the first result pattern R_P 1 and the second result pattern R_P2 from the pattern decomposition device 300. After that, the controller 200 may generate a new target pattern TGT_P based on the second temporary pattern TMP_P2, the first result pattern R_P1 and the second result pattern R_P2, transmit the new target pattern TGT_P and the direction signal DIRS to the pattern decomposition device 300, and receive another first result pattern R_P1 and another second result pattern R_P2 from the pattern decomposition device 300. The controller 200 and the pattern decomposition device 300 may repeat the operation described above to generate first through fourth decomposed patterns DC_P1, DC_P2, DC_P3 and DC_P4.

Referring to FIGS. 1 to 6, when the controller 200 receives the first temporary pattern TMP_P1 and the second temporary pattern TMP_P2 from the feature divider 100, the controller 200 may transmit the first temporary pattern TMP_P1 and a signal representing the first direction DIR1 to the pattern decomposition device 300 as the target pattern TGT_P and the direction signal DIRS, respectively. The pattern decomposition device 300 may generate a third temporary pattern TMP_P3 and a fourth temporary pattern TMP_P4 by performing a pattern dividing operation on the first temporary pattern TMP_P1 in the first direction DIR1, and transmit the third temporary pattern TMP_P3 and the fourth temporary pattern TMP_P4 to the controller 200 as the first result pattern R_P1 and the second result pattern R_P2, respectively (step S200).

Figure 7:
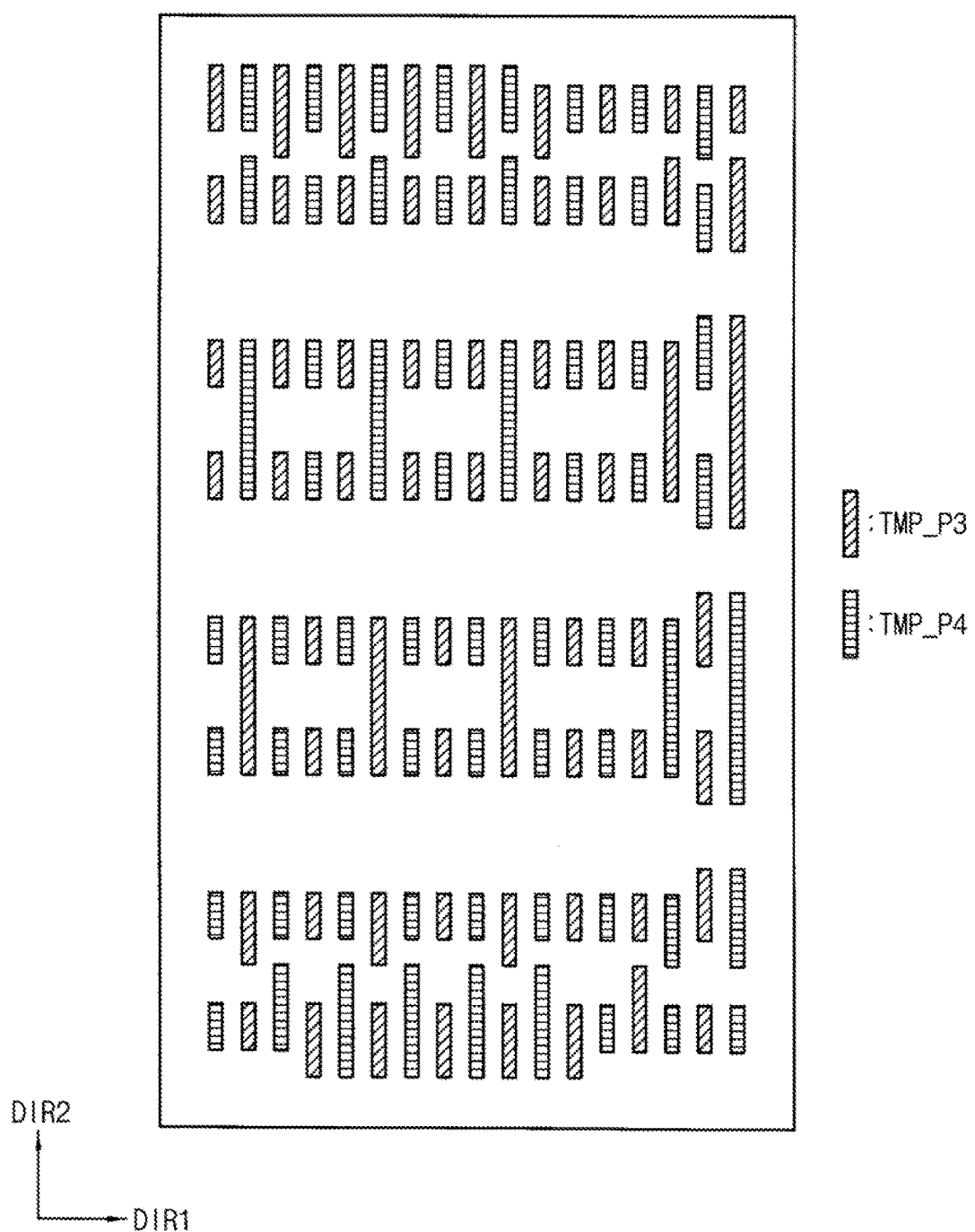
FIGS. 7, 8 and 9 illustrate an example of a third temporary pattern and a fourth temporary pattern generated by performing a pattern dividing operation on a first temporary pattern of FIG. 5 in a first direction.
Figure 8:
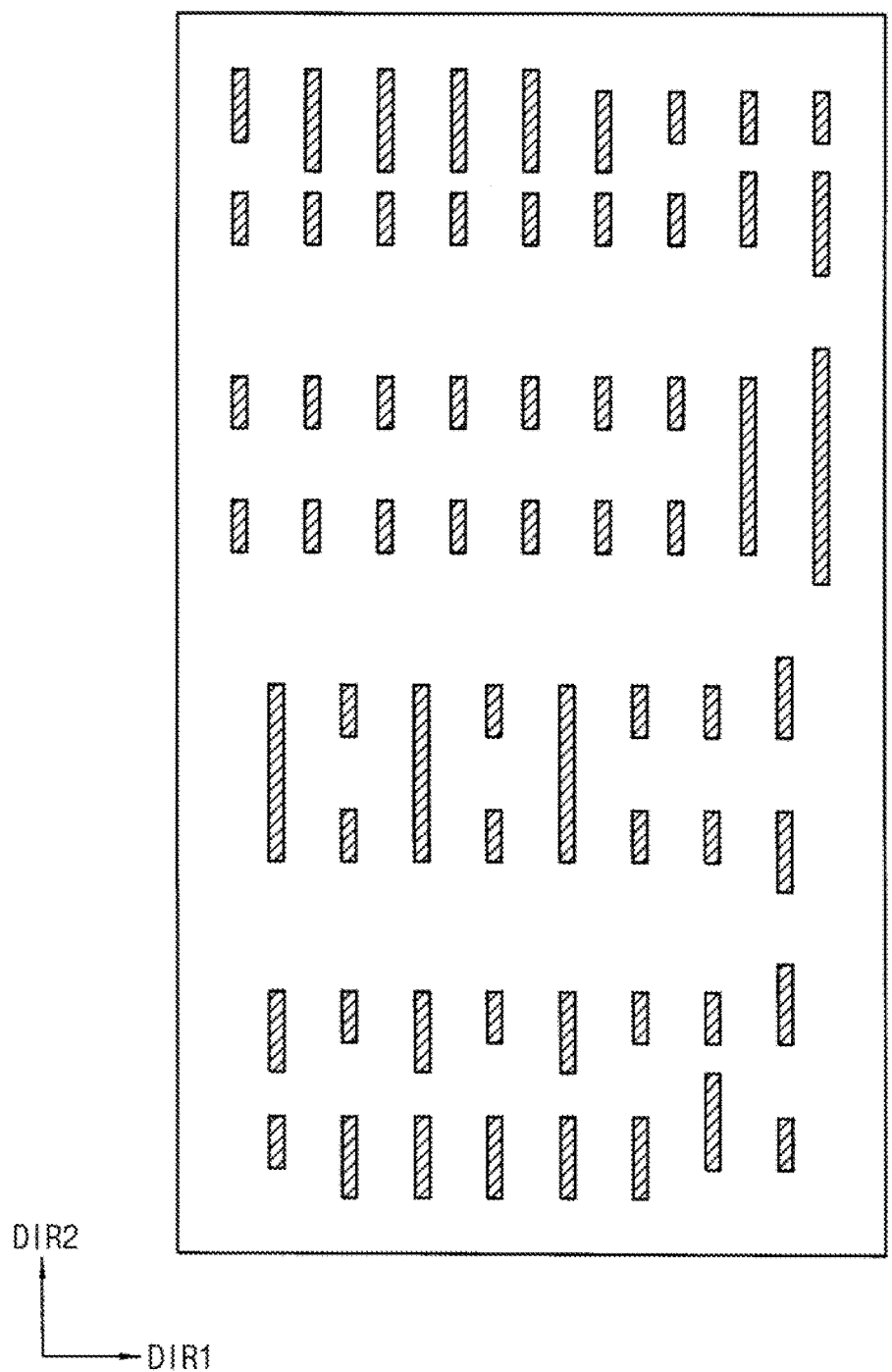
Figure 9:
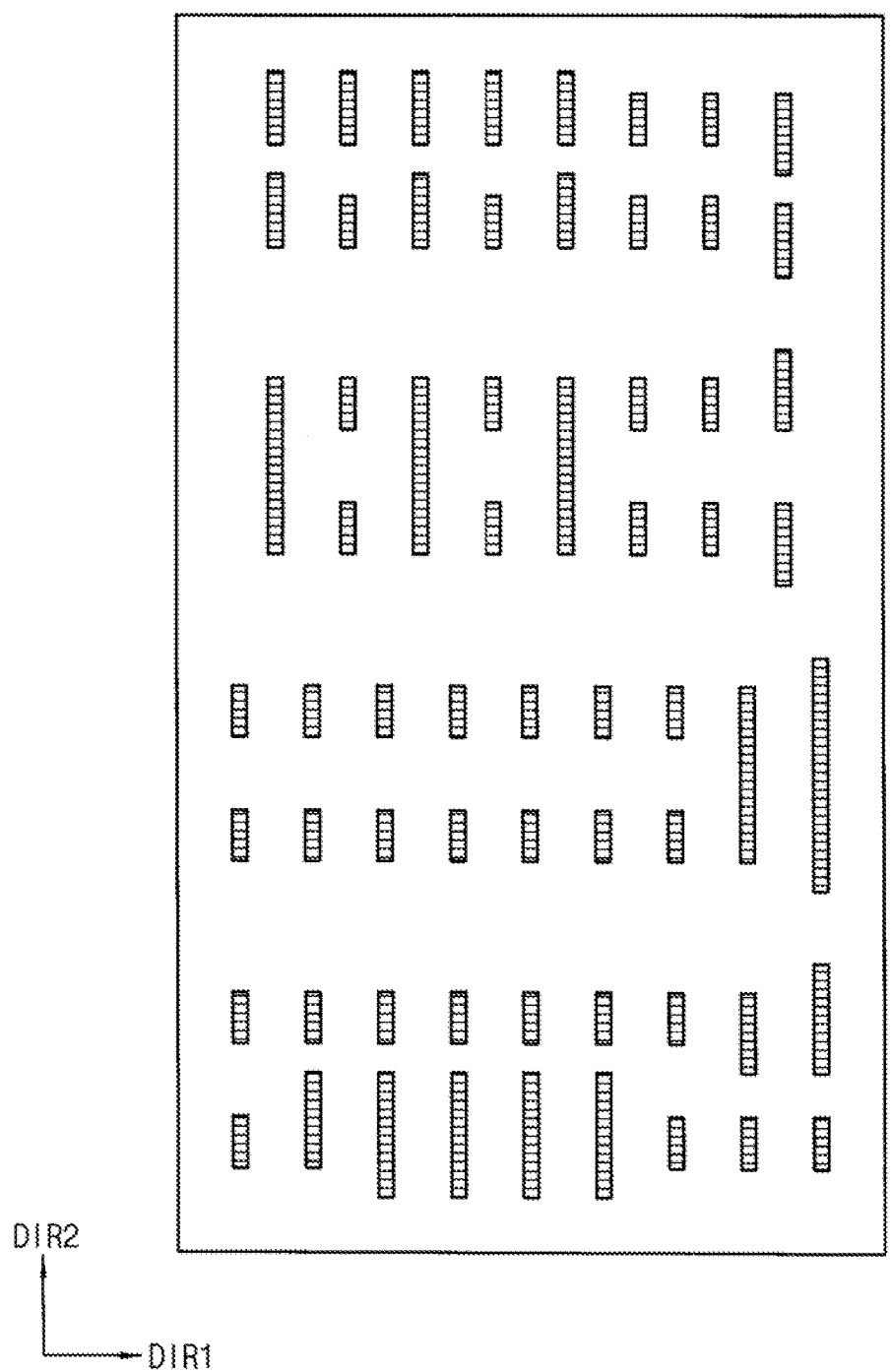

FIGS. 7, 8 and 9 illustrate a third temporary pattern and a fourth temporary pattern generated by performing a pattern dividing operation on a first temporary pattern of FIG. 5 in a first direction.

FIG. 7 represents a result of a pattern dividing operation performed on the first temporary pattern TMP_P1 by the pattern decomposition device 300 to generate the third temporary pattern TMP_P3 and the fourth temporary pattern TMP_P4. FIGS. 8 and 9 respectively represent the third temporary pattern TMP_P3 and the fourth temporary pattern TMP_P4.

As illustrated in FIGS. 7, 8 and 9, the pattern decomposition device 300 may generate the third temporary pattern TMP_P3 and the fourth temporary pattern TMP_P4 by separating two rectangular features RF, which are within the critical dimension of each other in the first direction DIR1 in the first temporary pattern TMP_P1, into the third temporary pattern TMP_P3 and the fourth temporary pattern TMP_P4.

After that, the controller 200 may generate a first target pattern TGT_P1 and a second target pattern TGT_P2 based on the second temporary pattern TMP_P2, the third temporary pattern TMP_P3 and the fourth temporary pattern TMP_P4. For example, the controller 200 may generate the first target pattern TGT_P1 and the second target pattern TGT_P2 by incorporating each of the cross couple features CCF included in the second temporary pattern TMP_P2 into one of the third temporary pattern TMP_P3 and the fourth temporary pattern TMP_P4 (step S300).

Figure 10:
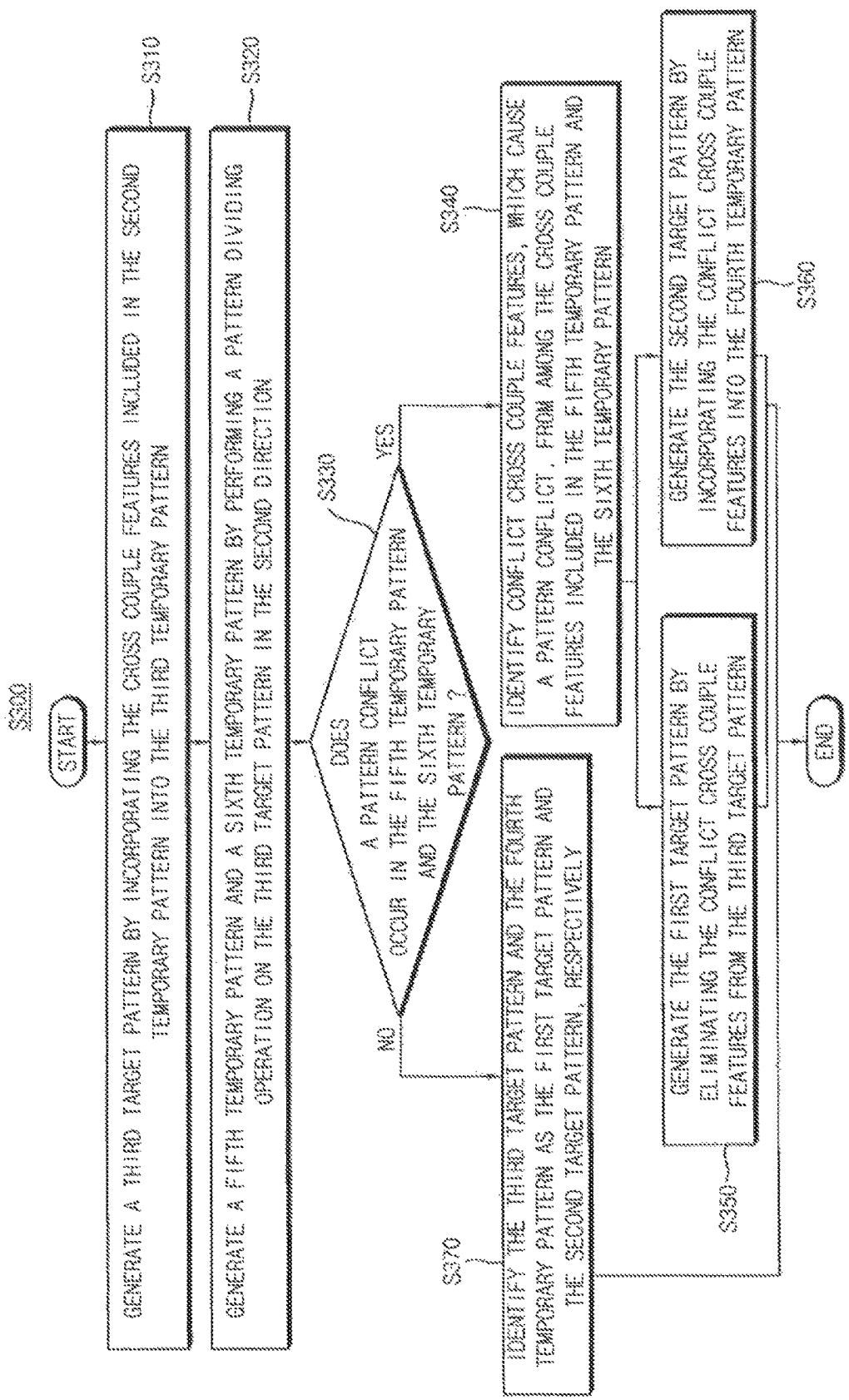
FIG. 10 is a flow chart of a process for generating a first target pattern and a second target pattern of FIG. 1.

FIG. 10 is a flow chart of a process of generating a first target pattern and a second target pattern (step S300) of FIG. 1. FIGS. 11 to 15 illustrate a process of FIG. 10.

Referring to FIGS. 10 to 15, the controller 200 may generate a third target pattern TGT_P3 by incorporating the cross couple features CCF included in the second temporary pattern TMP_P2 into the third temporary pattern TMP_P3 (step S310).

Figure 11:
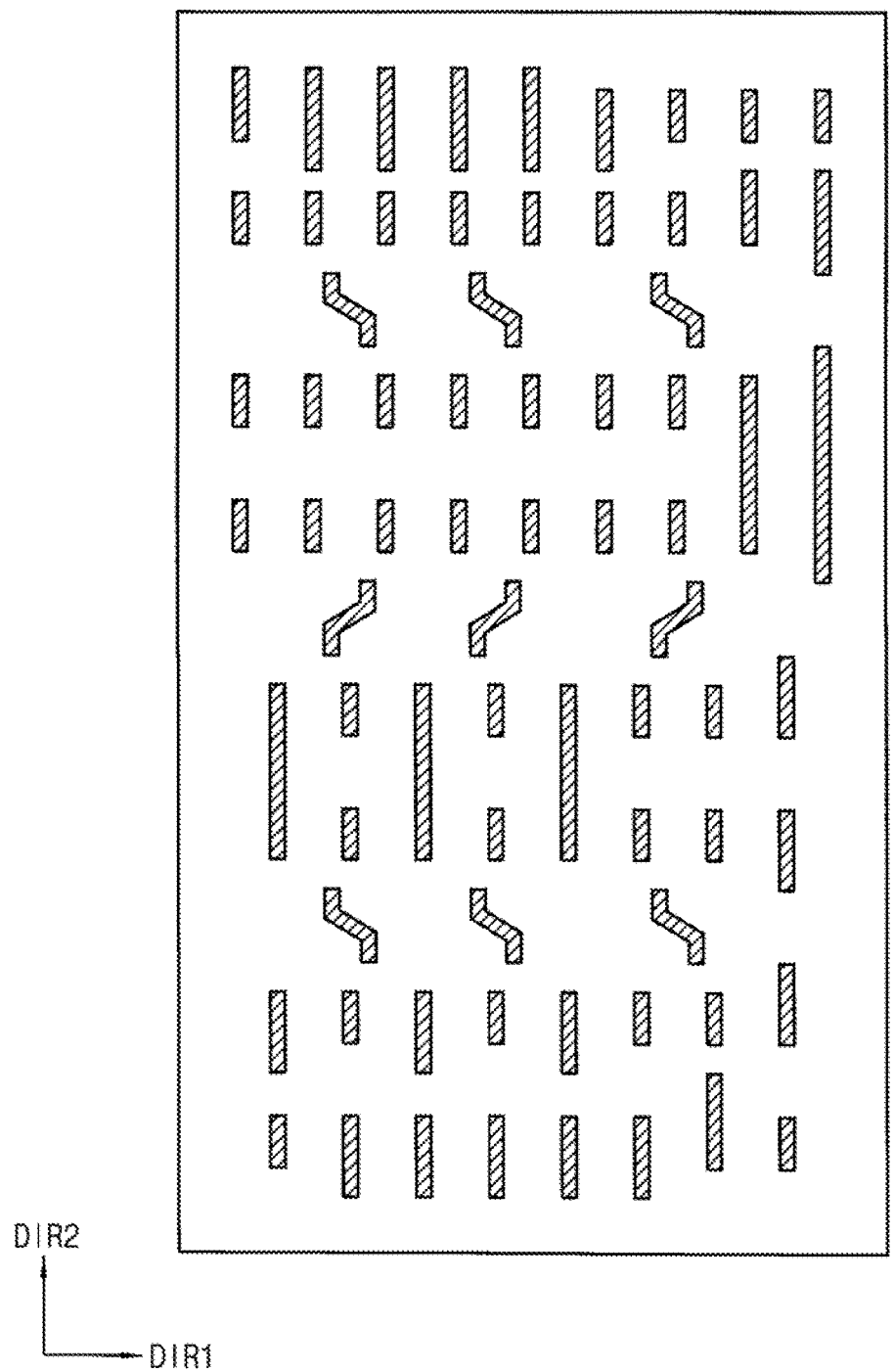
FIGS. 11 to 15 illustrate a process of FIG. 10.

As illustrated in FIG. 11, the third target pattern TGT_P3 may correspond to a combination of the rectangular features RF included in the third temporary pattern TMP_P3 of FIG. 8 and the cross couple features CCF included in the second temporary pattern TMP_P2 of FIG. 6.

The controller 200 may transmit the third target pattern TGT_P3 and a signal representing the second direction DIR2 to the pattern decomposition device 300 as the target pattern TGT_P and the direction signal DIRS, respectively. The pattern decomposition device 300 may generate a fifth temporary pattern TMP_P5 and a sixth temporary pattern TMP_P6 by performing a pattern dividing operation on the third target pattern TGT_P3 in the second direction DIR2, and transmit the fifth temporary pattern TMP_P5 and the sixth temporary pattern TMP_P6 to the controller 200 as the first result pattern R P1 and the second result pattern R_P2, respectively (step S320).

Figure 12:
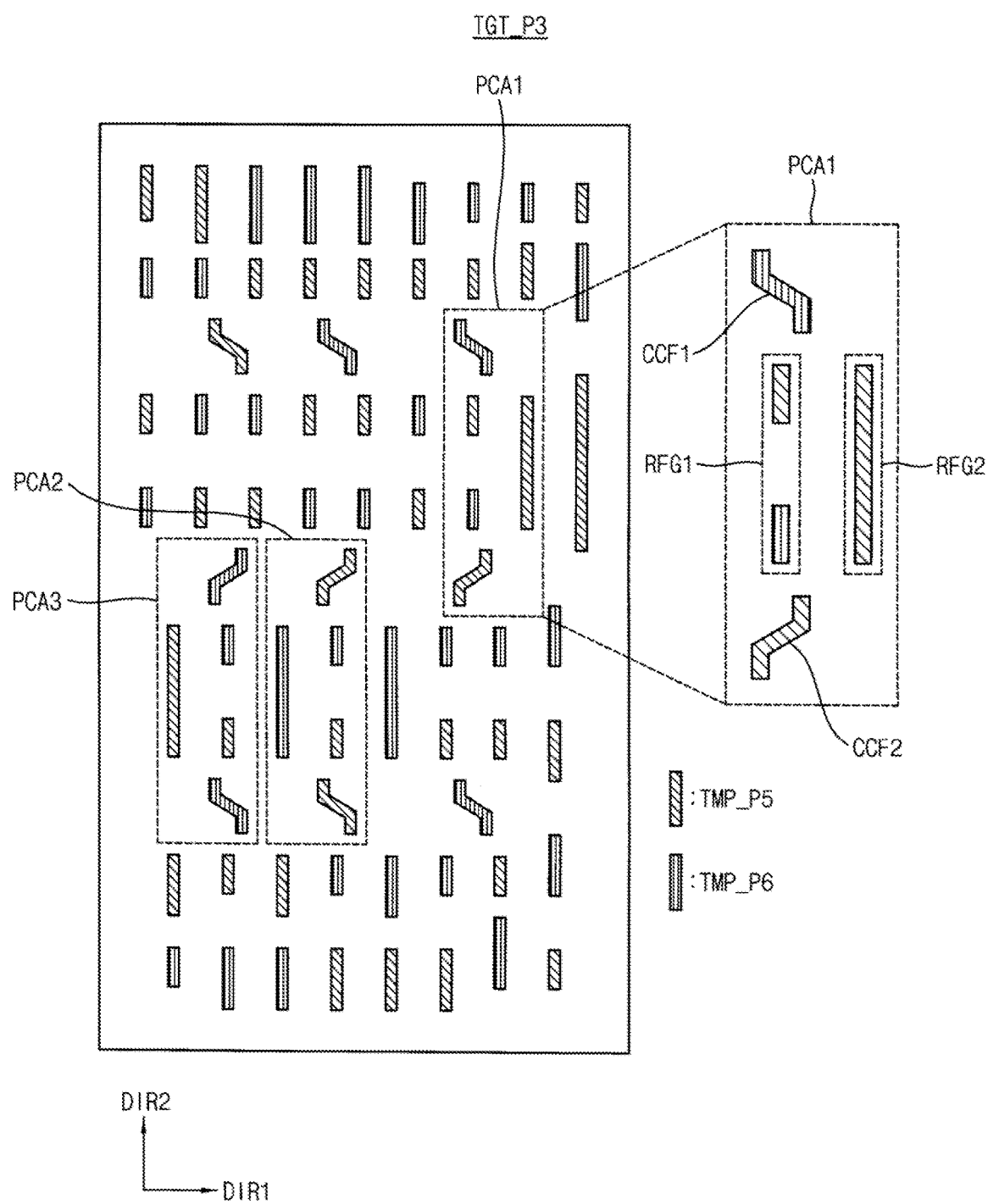

FIG. 12 illustrates an example of a fifth temporary pattern and a sixth temporary pattern generated by performing a pattern dividing operation on a third target pattern of FIG. 11 in a second direction.

As illustrated in FIG. 12, the pattern decomposition device 300 may generate the fifth temporary pattern TMP_P5 and the sixth temporary pattern TMP_P6 by separating two features, which are within the critical dimension of each other in the second direction DIR2 in the third target pattern TGT_P3, into the fifth temporary pattern TMP_P5 and the sixth temporary pattern TMP_P6.

After that, the controller 200 may determine whether a pattern conflict occurs in the fifth temporary pattern TMP_P5 and the sixth temporary pattern TMP_P6 (step S330). Here, the term "pattern conflict" means that at least two features included in a pattern are within the critical dimension of each other.

For example, in the case of the fifth temporary pattern TMP_P5 and the sixth temporary pattern TMP_P6 illustrated in FIG. 12, a pattern conflict occurs in first through third pattern conflict areas PCA1, PCA2 and PCA3.

As illustrated in the first through third pattern conflict areas PCA1, PCA2 and PCA3, a pattern conflict may occur when a first rectangular feature group RFG1, which includes an even number of the rectangular features RF within the critical dimension arranged along the second direction DIR2, and a second rectangular feature group RFG2, which includes an odd number of the rectangular features RF within the critical dimension that are arranged along the second direction DIR2, are located between a first cross couple feature CCF1 and a second cross couple feature CCF2 that are separated of each other along the second direction DIR2.

For example, in the first pattern conflict area PCA1, the second cross couple feature CCF2 may be included in the fifth temporary pattern TMP_P5, and one of two rectangular features RF that is between the second cross couple feature CCF2 may be included in the fifth temporary pattern TMP_P5. Therefore, a pattern conflict may occur in the first pattern conflict area PCA1.

If a pattern conflict occurs in the fifth temporary pattern TMP_P5 and the sixth temporary pattern TMP_P6 (step S330; yes), the controller 200 may identify conflict cross couple features CCCF from among the cross couple features CCF included in the fifth temporary pattern TMP_P5 and the sixth temporary pattern TMP_P6 (step S340) which cause the pattern conflict.

Figure 13:
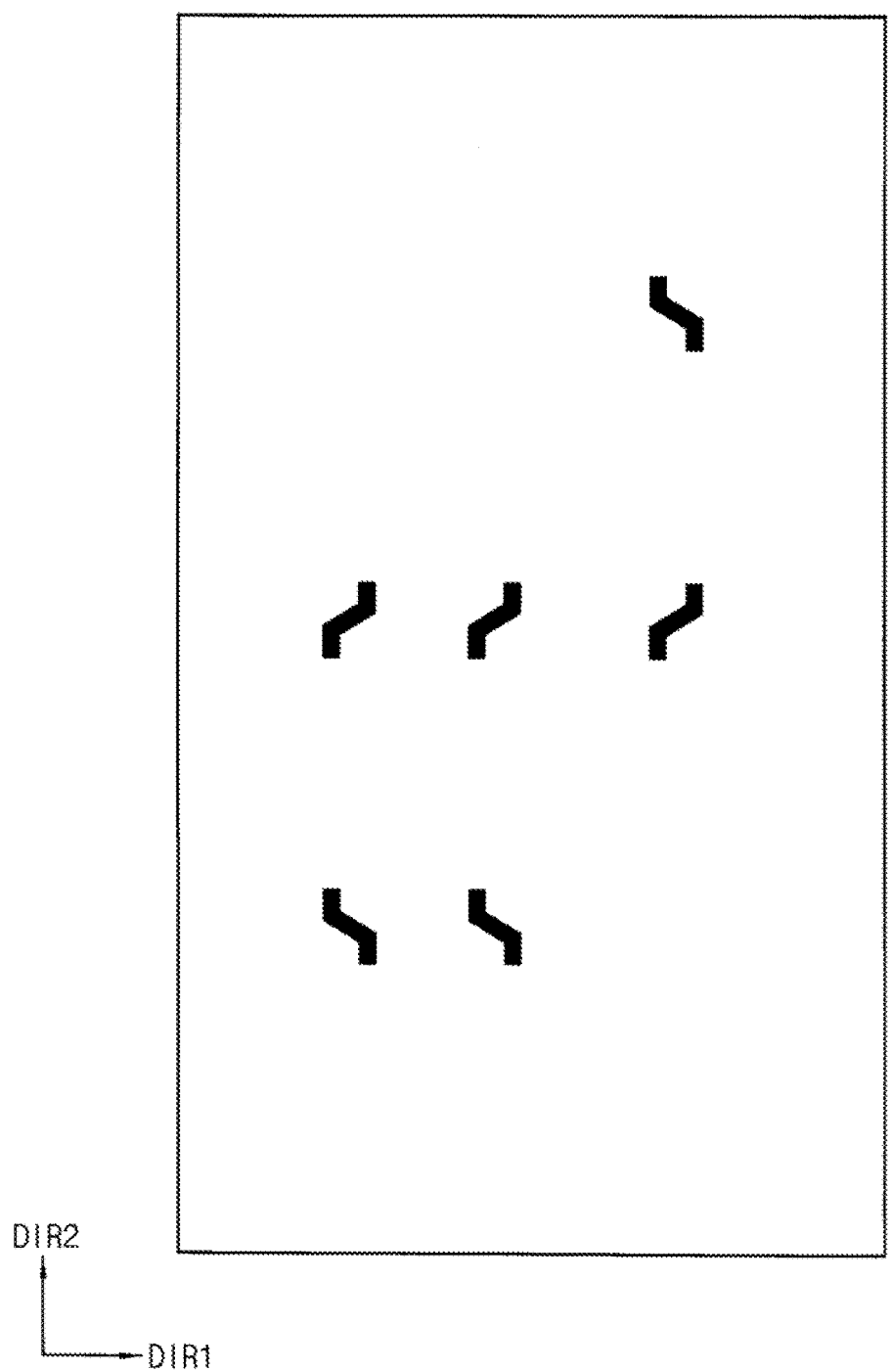

For example, in the case of the fifth temporary pattern TMP_P5 and the sixth temporary pattern TMP_P6 illustrated in FIG. 12, the controller 200 may identify the cross couple features CCF included in the first through third pattern conflict areas PCA1, PCA2 and PCA3 as the conflict cross couple features CCCF. FIG. 13 illustrates the cross couple features CCF identified as the conflict cross couple features CCCF by the controller 200.

The controller 200 may generate the first target pattern TGT_P1 by eliminating the conflict cross couple features CCCF from the third target pattern TGT_P3 (step S350).

Figure 14:
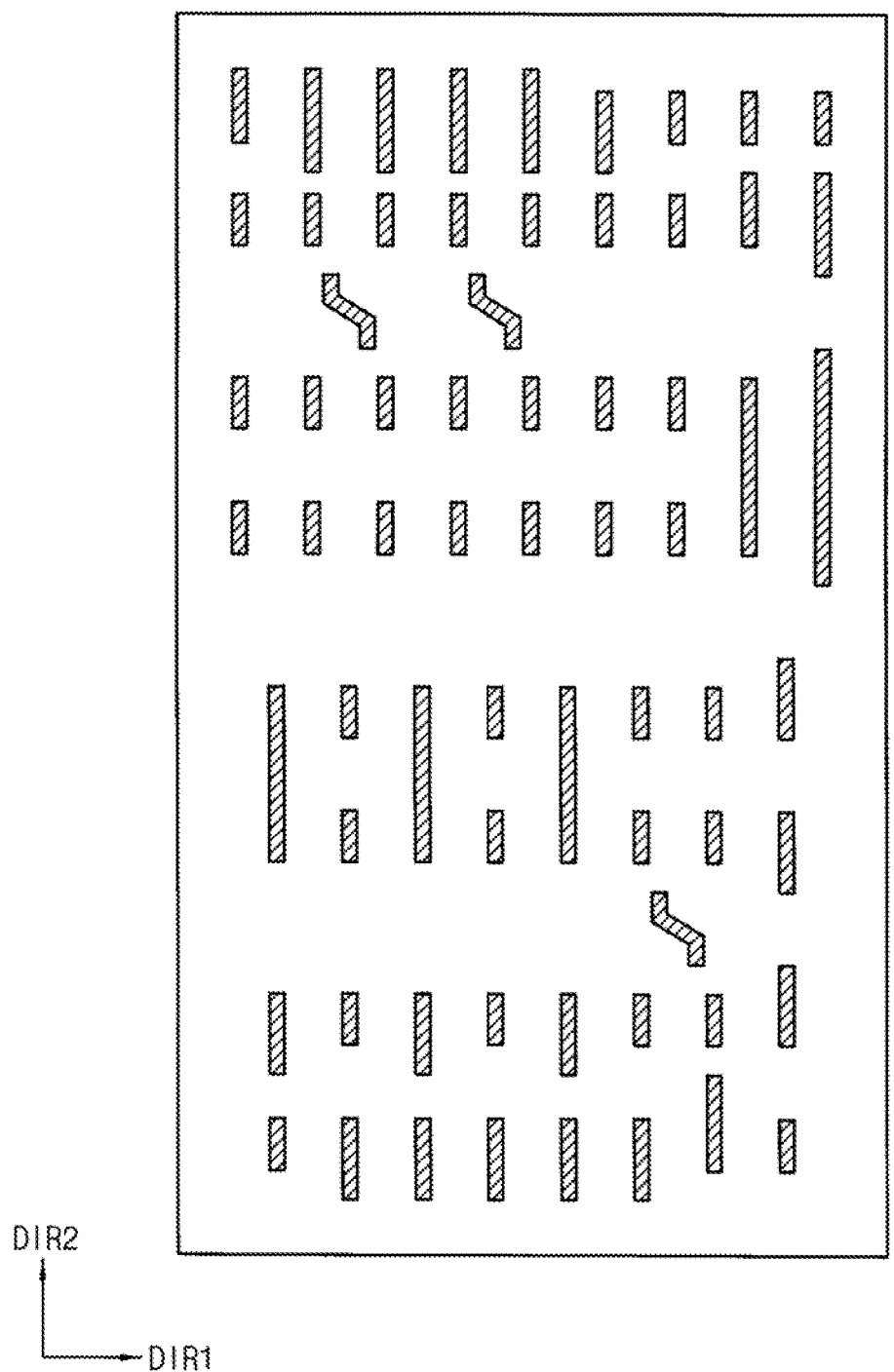

As illustrated in FIG. 14, the first target pattern TGT _P 1 may correspond to a pattern generated by eliminating the conflict cross couple features CCCF of FIG. 13 from the third target pattern TGT_P3 of FIG. 11.

In addition, the controller may generate the second target pattern TGT_P2 by incorporating the conflict cross couple features CCCF into the fourth temporary pattern TMP_P4 (step S360).

Figure 15:
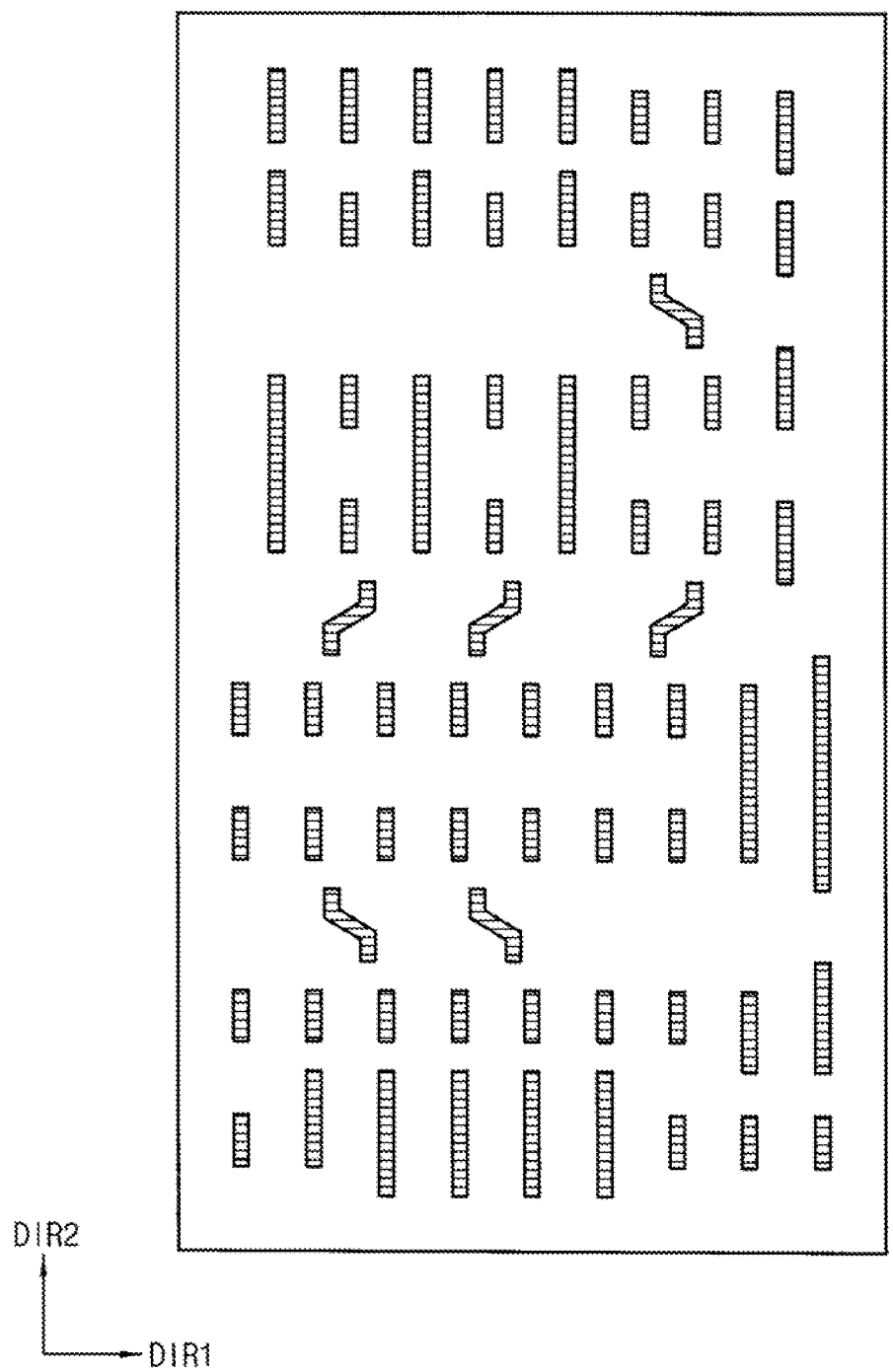

As illustrated in FIG. 15, the second target pattern TGT_P2 may correspond to a combination of the conflict cross couple features CCCF of FIG. 13 and the fourth temporary pattern TMP_P4 of FIG. 9.

If no pattern conflict occurs in the fifth temporary pattern TMP_P5 and the sixth temporary pattern TMP_P6 (step S330; no), the controller 200 may identify the third target pattern TGT_P3 and the fourth temporary pattern TMP_P4 as the first target pattern TGT_P1 and the second target pattern TGT_P2, respectively (step S370).

After that, under control of the controller 200, the pattern decomposition device 300 may generate the first through fourth decomposed patterns DC_P1, DC_P2, DC_P3 and DC_P4 by performing a pattern dividing operation on the first target pattern TGT_P1 and the second target pattern TGT_P2 in the second direction DIR2 (step S400).

Figure 16:
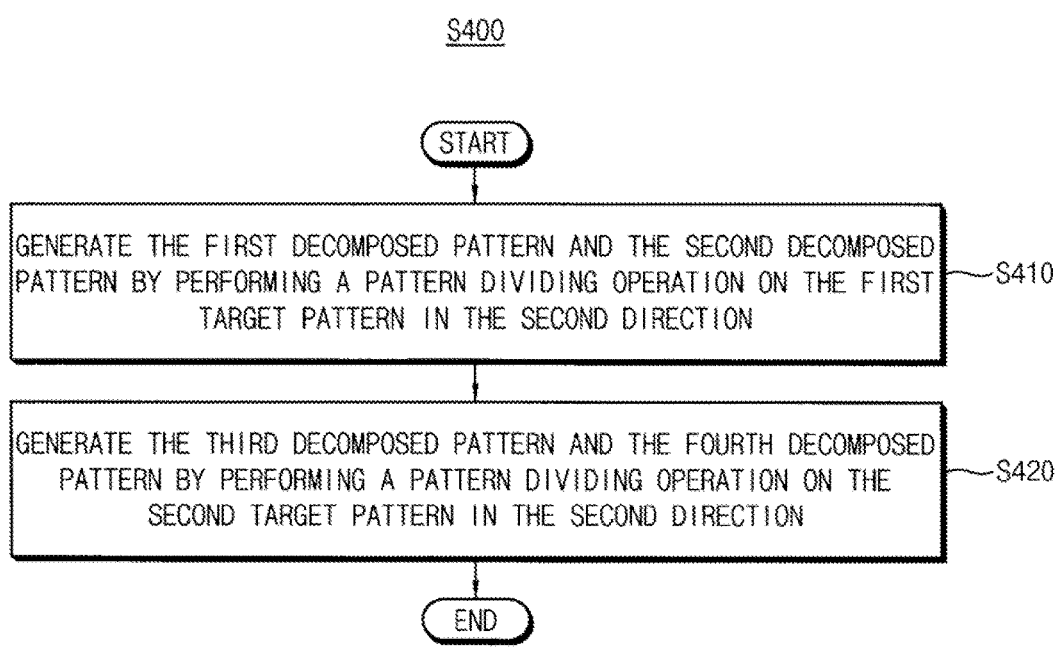
FIG. 16 is a flow chart illustrating a process of generating first through fourth decomposed patterns of FIG. 1.
Figure 17:
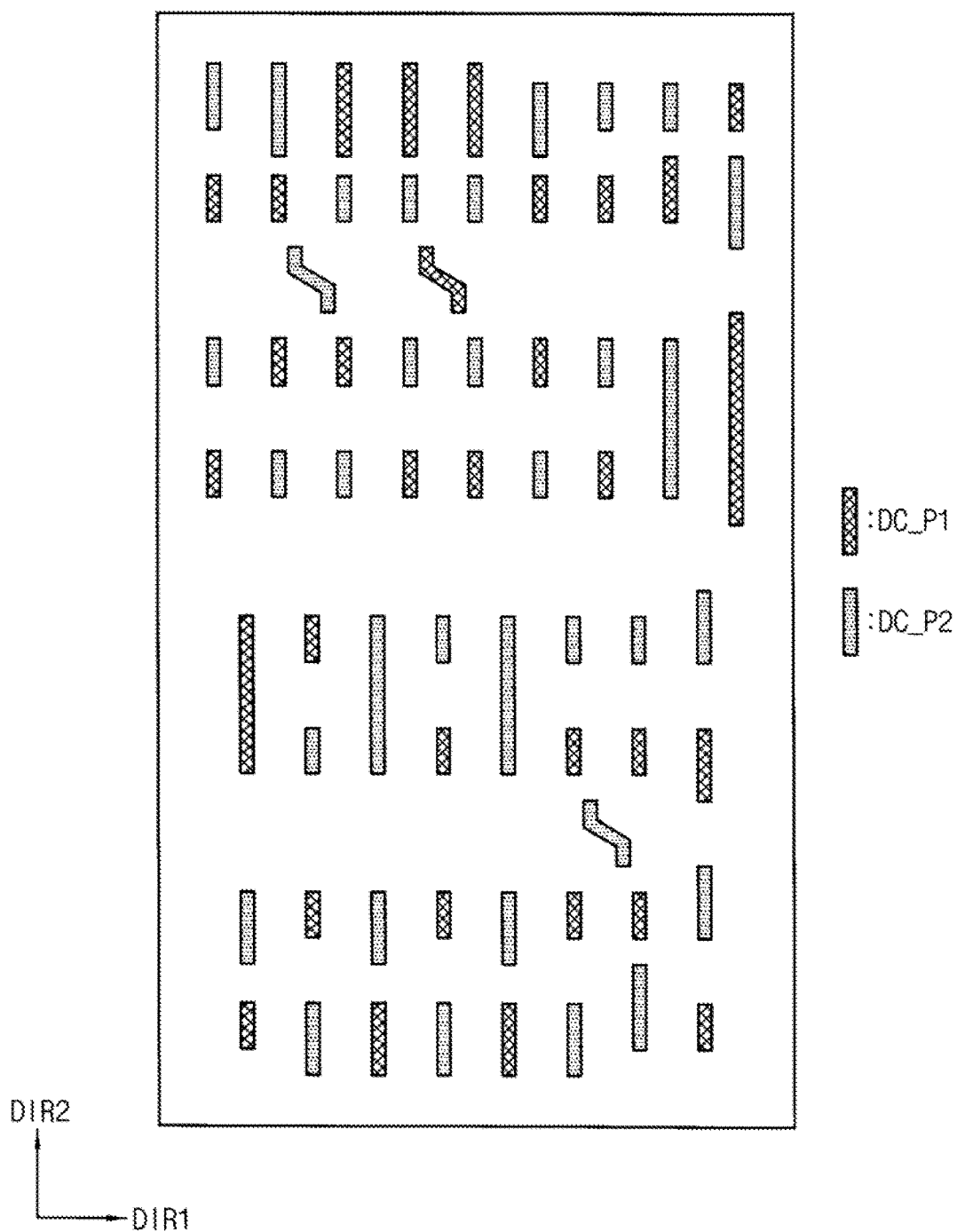
FIGS. 17 to 19 illustrate a process of FIG. 16.
Figure 18:
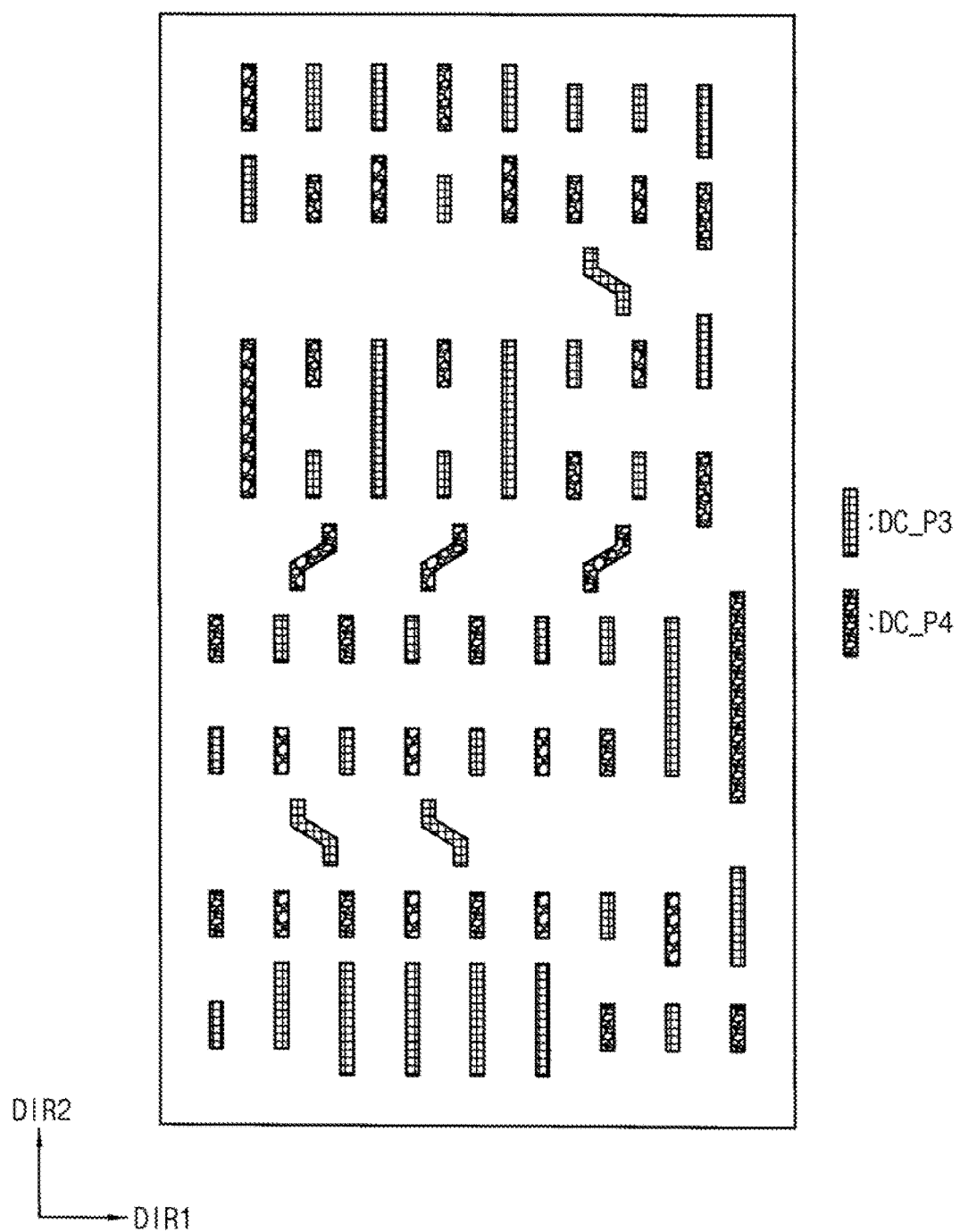
Figure 19:
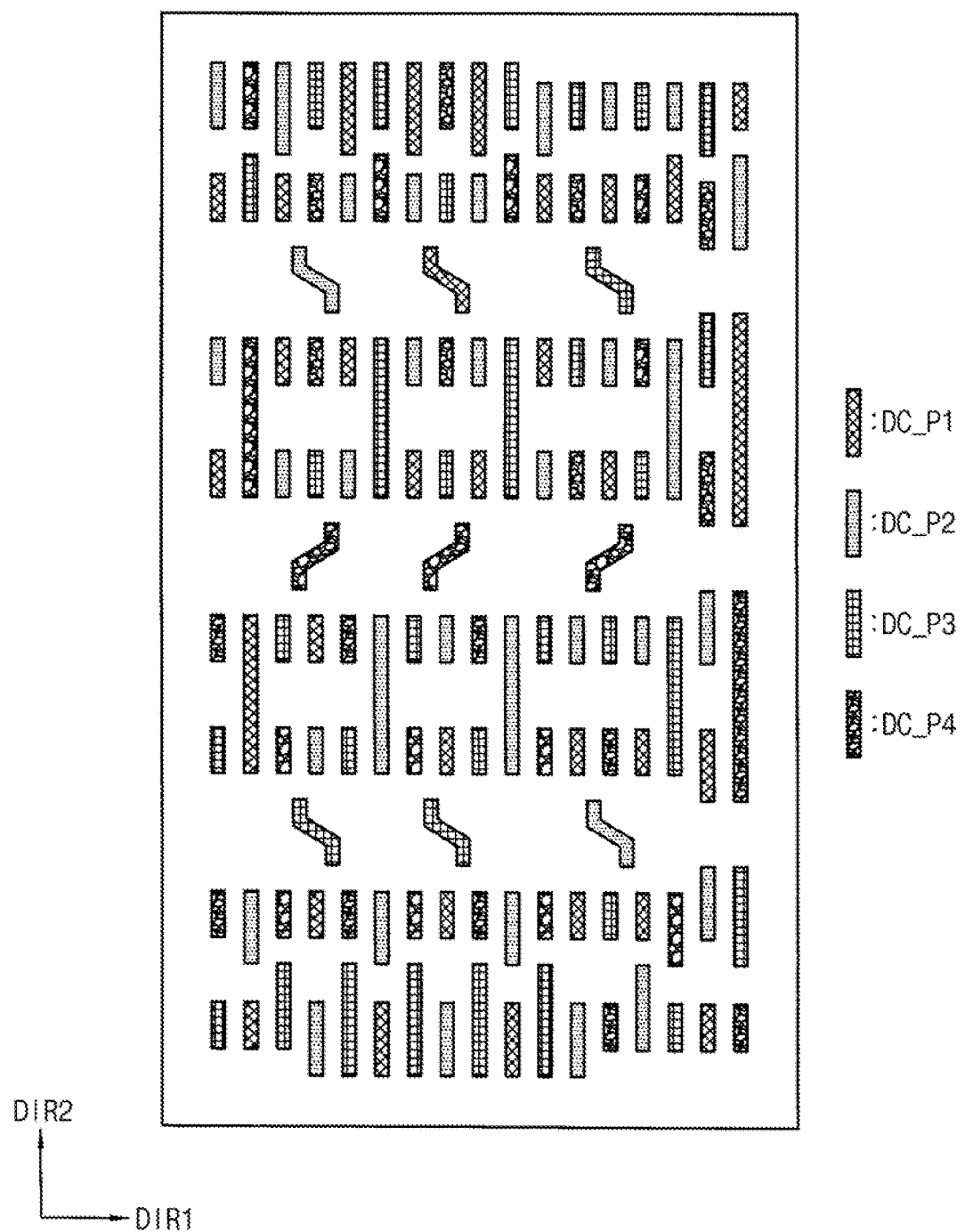

FIG. 16 is a flow chart illustrating a process of generating first through fourth decomposed patterns (step S400) of FIG. 1. FIGS. 17 to 19 illustrate a process of FIG. 16.

Referring to FIGS. 16 to 19, the controller 200 may transmit the first target pattern TGT_P1 and a signal representing the second direction DIR2 to the pattern decomposition device 300 as the target pattern TGT_P and the direction signal DIRS, respectively. The pattern decomposition device 300 may generate the first decomposed pattern DC_P1 and the second decomposed pattern DC_P2 by performing a pattern dividing operation on the first target pattern TGT_Pl in the second direction DIR2, and transmit the first decomposed pattern DC_P 1 and the second decomposed pattern DC_P2 to the controller 200 as the first result pattern R_P1 and the second result pattern R_P2, respectively (step S410).

As illustrated in FIG. 17, the pattern decomposition device 300 may generate the first decomposed pattern DC_P1 and the second decomposed pattern DC_P2 by separating two features among the rectangular features RF and the cross couple features CCF included in the first target pattern TGT_P1, which are within the critical dimension of each other in the second direction DIR2, into the first decomposed pattern DC_P1 and the second decomposed pattern DC_P2.

In addition, the controller 200 may transmit the second target pattern TGT_P2 and a signal representing the second direction DIR2 to the pattern decomposition device 300 as the target pattern TGT_P and the direction signal DIRS, respectively. The pattern decomposition device 300 may generate the third decomposed pattern DC_P3 and the fourth decomposed pattern DC_P4 by performing a pattern dividing operation on the second target pattern TGT_P2 in the second direction DIR2, and transmit the third decomposed pattern DC_P3 and the fourth decomposed pattern DC_P4 to the controller 200 as the first result pattern R_P1 and the second result pattern R_P2, respectively (step S420).

As illustrated in FIG. 18, the pattern decomposition device 300 may generate the third decomposed pattern DC_P3 and the fourth decomposed pattern DC_P4 by separating two features from among the rectangular features RF and the cross couple features CCF included in the second target pattern TGT_P2, which are within the critical dimension of each other in the second direction DIR2, into the third decomposed pattern DC_P3 and the fourth decomposed pattern DC_P4.

As described above, the first target pattern TGT_P1 may be generated by eliminating the conflict cross couple features CCCF, which cause a pattern conflict when a pattern dividing operation is performed on the third target pattern TGT_P3 in the second direction DIR2, from the third target pattern TGT_P3, and the second target pattern TGT_P2 may be generated by incorporating the conflict cross couple features CCCF into the fourth temporary pattern TMP_P4. Therefore, as illustrated in FIG. 17, no pattern conflict may occur in the first decomposed pattern DC_P1 and the second decomposed pattern DC_P2 that are generated by decomposing the first target pattern TGT_P1. In addition, as illustrated in FIG. 18, no pattern conflict may occur in the third decomposed pattern DC_P3 and the fourth decomposed pattern DC_P4 that are generated by decomposing the second target pattern TGT_P2.

The controller 200 may output the first through fourth decomposed patterns DC_P1, DC_P2, DC_P3 and DC_P4 as decomposed patterns of the layout LO of the semiconductor for a QPT process.

FIG. 19 illustrates the first through fourth decomposed patterns DC_P1, DC_P2, DC_P3 and DC_P4 generated by the layout decomposition device 10 of FIG. 2 based on the layout LO of the semiconductor of FIG. 3.

In some exemplary embodiments, the semiconductor device may correspond to a system-on-chip that includes a logic circuit.

In some exemplary embodiments, the layout decomposition device 10 may display the first through fourth decomposed patterns DC_P1, DC_P2, DC_P3 and DC_P4 with differing first through fourth colors, respectively. Therefore, the first through fourth decomposed patterns DC_P1, DC_P2, DC_P3 and DC_P4 may be visibly displayed in one layout diagram.

As described above with reference to FIGS. 1 to 19, in a method of decomposing a layout of a semiconductor device for a QPT process of FIG. 1, which may be performed by a layout decomposition device 10 of FIG. 2, the layout LO of the semiconductor device may be decomposed into first through fourth decomposed patterns DC_P1, DC_P2, DC_P3 and DC_P4 for a QPT process using a double pattern dividing algorithm used in a DPT process. Therefore, a speed of performing a QPT process may be effectively increased.

Figure 20:
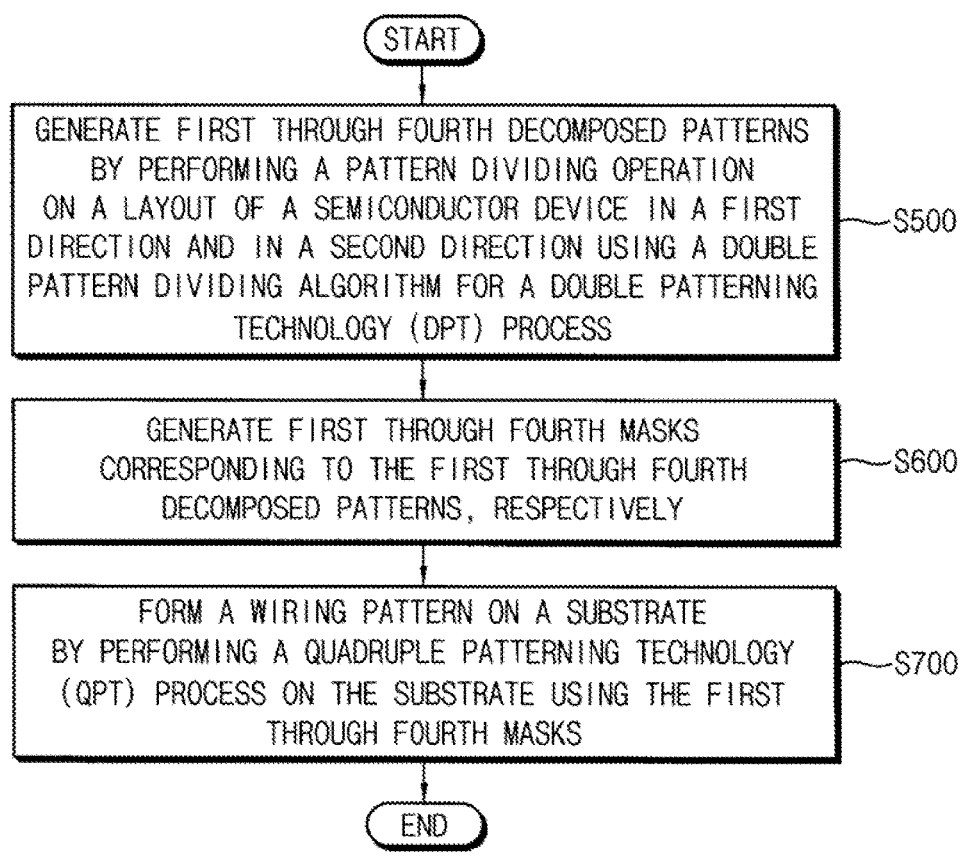
FIG. 20 is a flow chart illustrating a method of manufacturing a semiconductor device according to exemplary embodiments.

FIG. 20 is a flow chart illustrating a method of manufacturing a semiconductor device according to exemplary embodiments.

In FIG. 20, a method of manufacturing a semiconductor device using a QPT process is illustrated.

Referring to FIG. 20, first through fourth decomposed patterns are generated by performing a pattern dividing operation on a layout of a semiconductor device in a first direction and in a second direction using a double pattern dividing algorithm for a DPT process (step S500). The second direction may be substantially perpendicular to the first direction.

The first through fourth decomposed patterns may be generated by decomposing the layout of the semiconductor device using a method of decomposing a layout of a semiconductor device for a QPT process of FIG. 1. Therefore, the first through fourth decomposed patterns corresponding to the layout of the semiconductor device may be generated by a layout decomposition device 10 of FIG. 2. A method of decomposing a layout of a semiconductor device for a QPT process of FIG. 1 and a layout decomposition device 10 of FIG. 2 are described above with reference to FIGS. 1 to 19. Therefore, a detailed description of a process of generating the first through fourth decomposed patterns (step S500) will be omitted here.

After that, first through fourth masks, which correspond to the first through fourth decomposed patterns, respectively, are generated (step S600), and a wiring pattern is formed on a substrate by performing a QPT process on the substrate using the first through fourth masks (step S700).

According to exemplary embodiments, various types of QPT processes may be used to form a wiring pattern on a substrate based on the first through fourth masks.

FIGS. 21 to 31 illustrate an example of a process of forming a wiring pattern on a substrate of FIG. 20.

Figure 21:
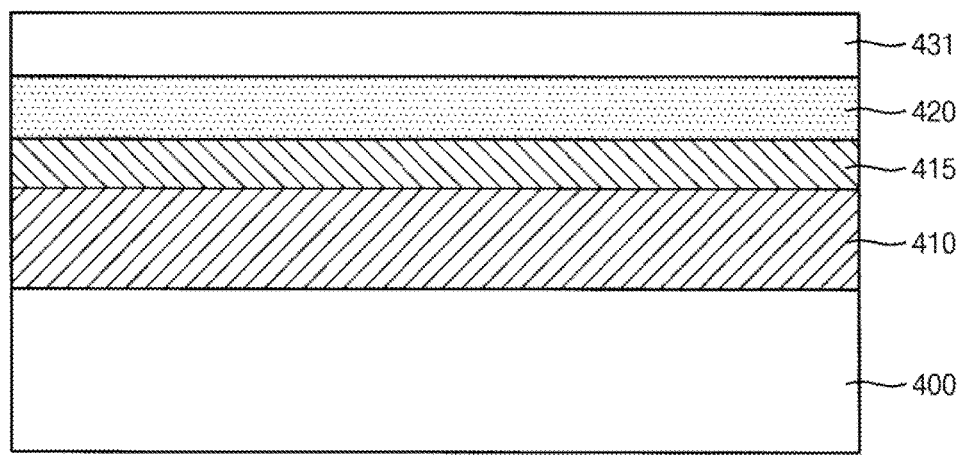
FIGS. 21 to 31 illustrate an example of a process of forming a wiring pattern on a substrate of FIG. 20.

Referring to FIG. 21, an ultra low dielectric layer 410 may be formed on a substrate 400. The substrate 400 may include silicon Si. The ultra low dielectric layer 410 may include a material having an ultra low dielectric constant (ULK). In some exemplary embodiments, the ultra low dielectric layer 410 may correspond to a silicon oxide layer (SiO2) formed by performing an oxidation process on the substrate 400.

A sacrificial layer 415 may be formed on the ultra low dielectric layer 410, and a hard mask layer 420 may be formed on the sacrificial layer 415. As will be described below, a mask pattern may be formed in the hard mask layer 420 by performing a plurality of etching processes on the hard mask layer 420, and trenches may be formed in the ultra low dielectric layer 410 by etching the ultra low dielectric layer 410 using the mask pattern as an etching mask. The sacrificial layer 415 may prevent the ultra low dielectric layer 410 from being etched during the plurality of etching processes performed on the hard mask layer 420 to form the mask pattern.

A first photoresist layer 431 may be coated on the hard mask layer 420.

Figure 22:
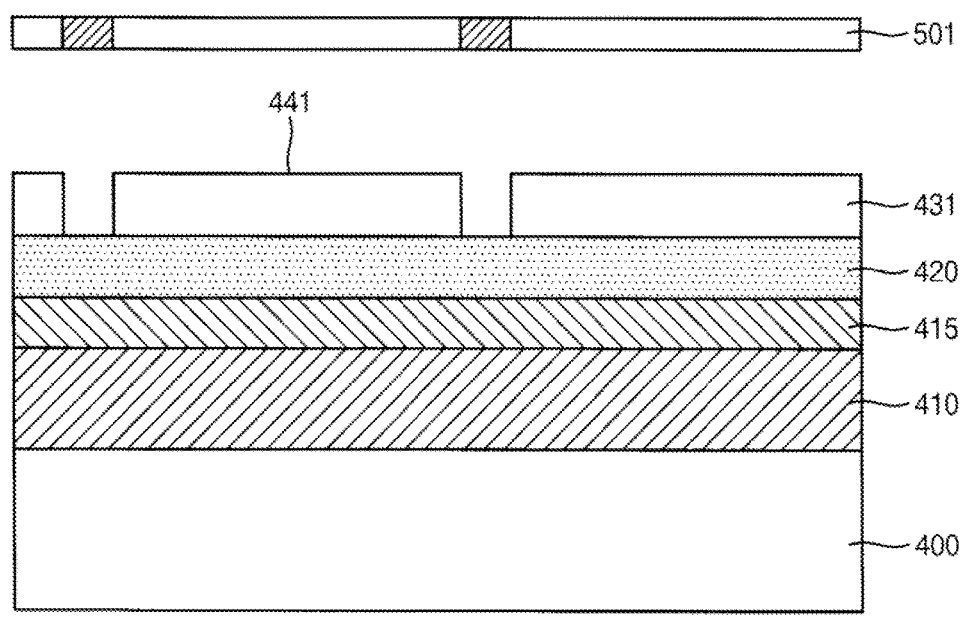

In FIG. 22, a first mask 501 may be manufactured based on the first decomposed pattern DC_P1, which is generated by a method of decomposing a layout of a semiconductor device for a QPT process of FIG. 1.

Referring to FIG. 22, a first photoresist pattern 441 may be formed by performing a photolithography process and a development process on the first photoresist layer 431 using the first mask 501.

Figure 23:
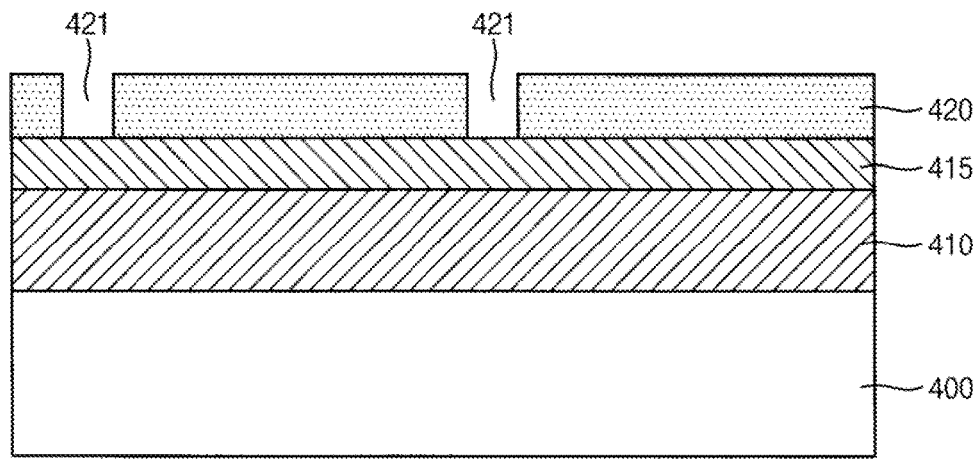

Referring to FIG. 23, a first mask pattern 421 may be formed by etching the hard mask layer 420 using the first photoresist pattern 441 as an etching mask. After that, the first photoresist layer 431 may be removed.

Figure 24:
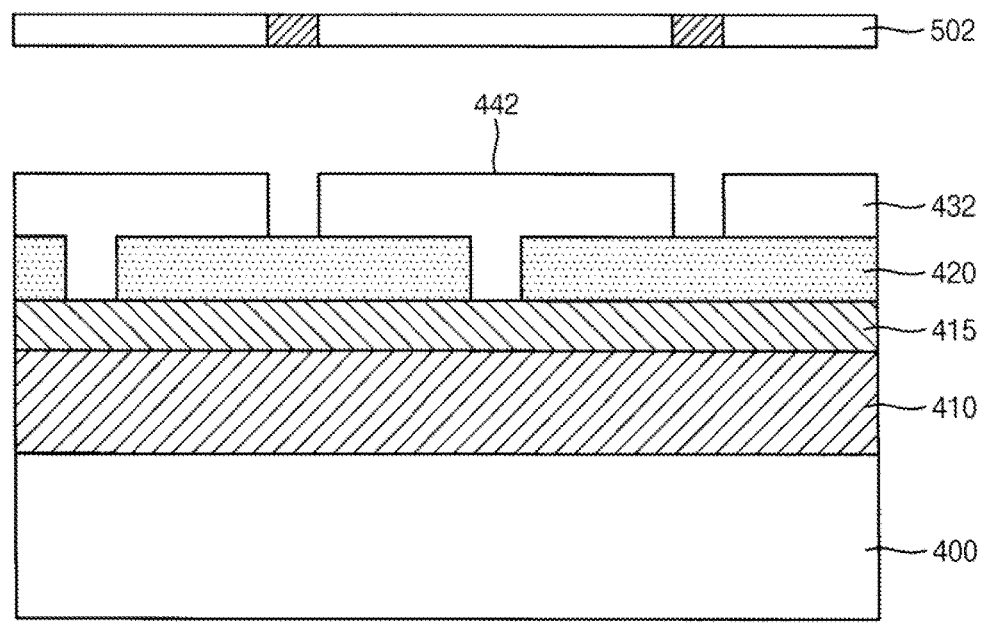

In FIG. 24, a second mask 502 may be manufactured based on the second decomposed pattern DC_P2, which is generated by a method of decomposing a layout of a semiconductor device for a QPT process of FIG. 1.

Referring to FIG. 24, a second photoresist layer 432 may be coated on the hard mask layer 420, and a second photoresist pattern 442 may be formed by performing a photolithography process and a development process on the second photoresist layer 432 using the second mask 502.

Figure 25:
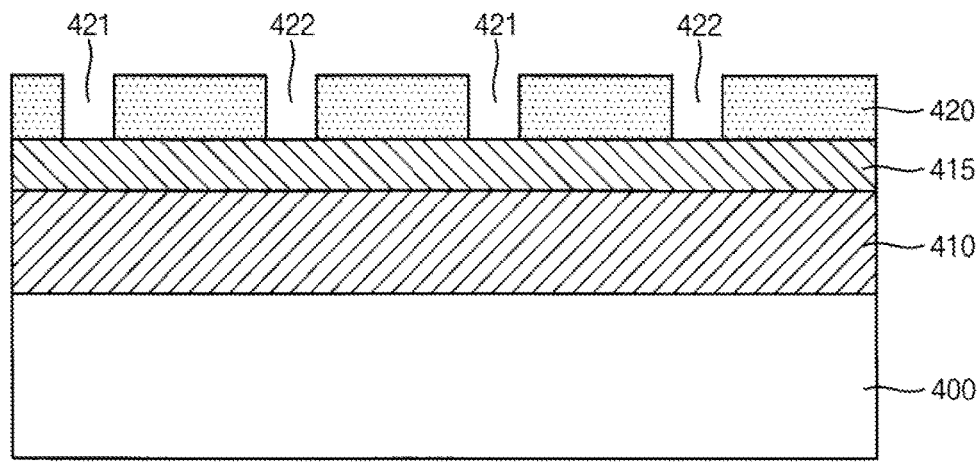

Referring to FIG. 25, a second mask pattern 422 may be formed by etching the hard mask layer 420 using the second photoresist pattern 442 as an etching mask. After that, the second photoresist layer 432 may be removed.

Figure 26:
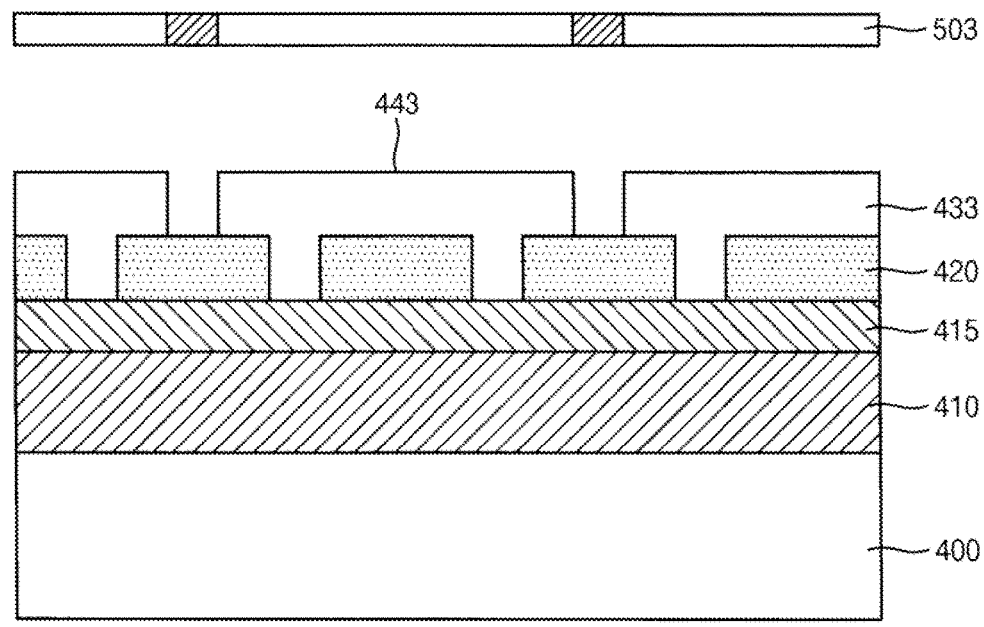

In FIG. 26, a third mask 503 may be manufactured based on the third decomposed pattern DC_P3, which is generated by a method of decomposing a layout of a semiconductor device for a QPT process of FIG. 1.

Referring to FIG. 26, a third photoresist layer 433 may be coated on the hard mask layer 420, and a third photoresist pattern 443 may be formed by performing a photolithography process and a development process on the third photoresist layer 433 using the third mask 503.

Figure 27:
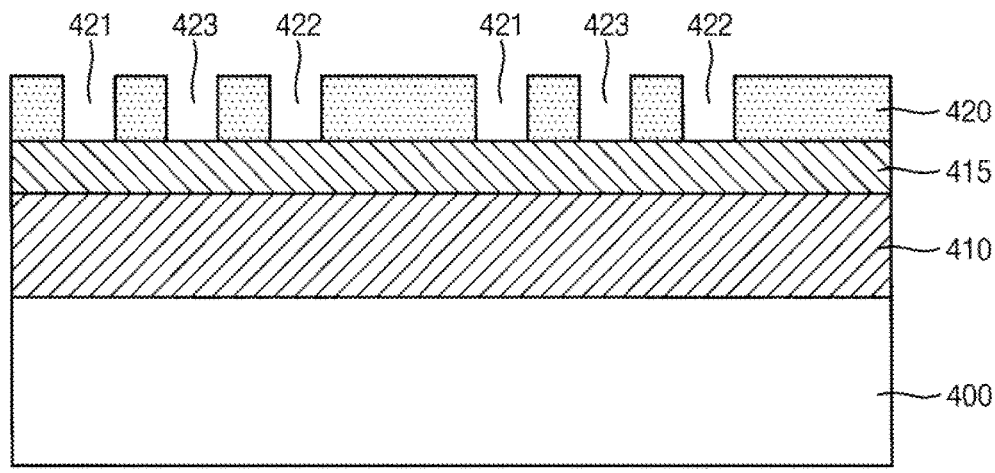

Referring to FIG. 27, a third mask pattern 423 may be formed by etching the hard mask layer 420 using the third photoresist pattern 443 as an etching mask. After that, the third photoresist layer 433 may be removed.

Figure 28:
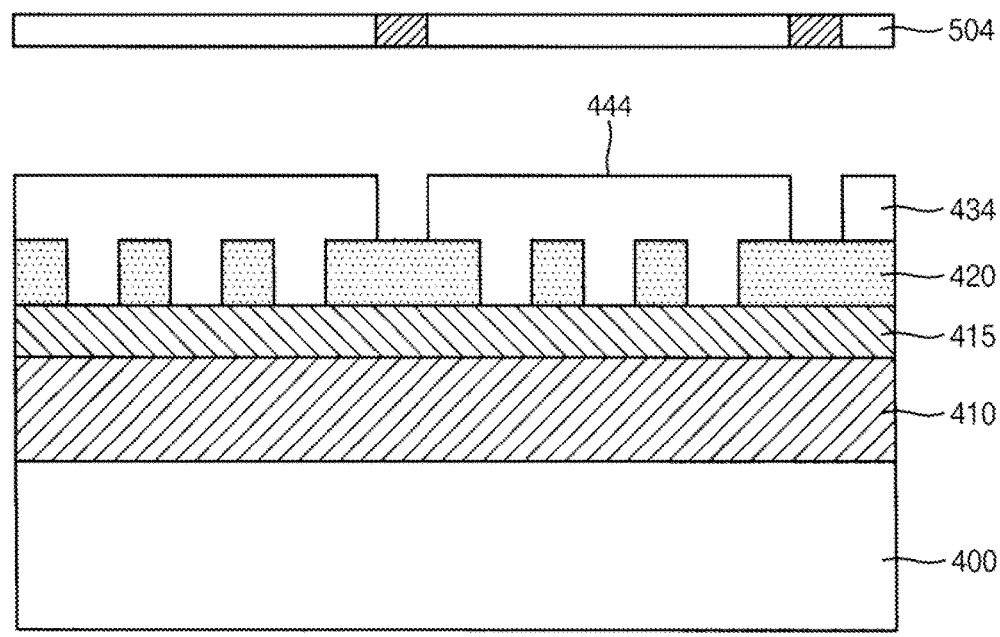

In FIG. 28, a fourth mask 504 may be manufactured based on the fourth decomposed pattern DC P4, which is generated by a method of decomposing a layout of a semiconductor device for a QPT process of FIG. 1.

Referring to FIG. 28, a fourth photoresist layer 434 may be coated on the hard mask layer 420, and a fourth photoresist pattern 444 may be formed by performing a photolithography process and a development process on the fourth photoresist layer 434 using the fourth mask 504.

Figure 29:
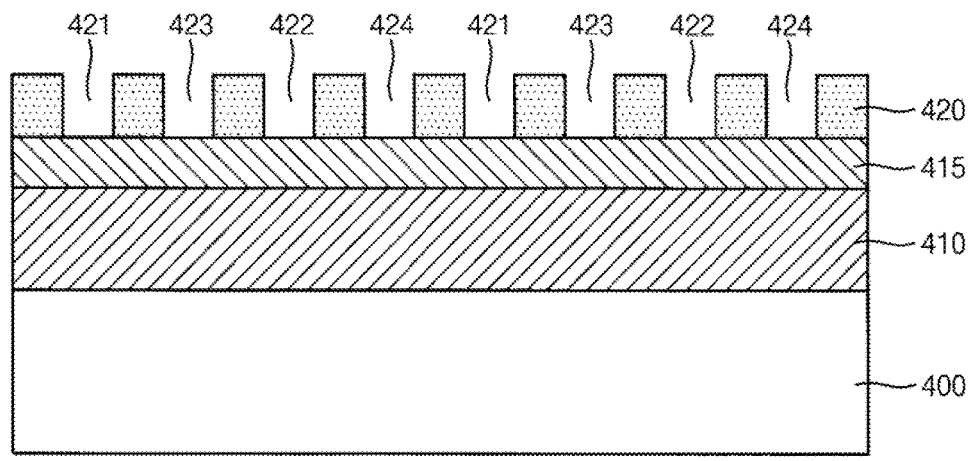

Referring to FIG. 29, a fourth mask pattern 424 may be formed by etching the hard mask layer 420 using the fourth photoresist pattern 444 as an etching mask. After that, the fourth photoresist layer 434 may be removed.

As described above with reference to FIGS. 21 to 29, the first through fourth mask patterns 421, 422, 423 and 424, which correspond to the layout LO of the semiconductor, may be formed in the hard mask layer 420 by performing a QPT process on the substrate 400 using the first through fourth decomposed patterns DC_P1, DC_P2, DC_P3 and DC_P4, which are generated by a method of decomposing a layout of a semiconductor device for a QPT process of FIG. 1.

Figure 30:
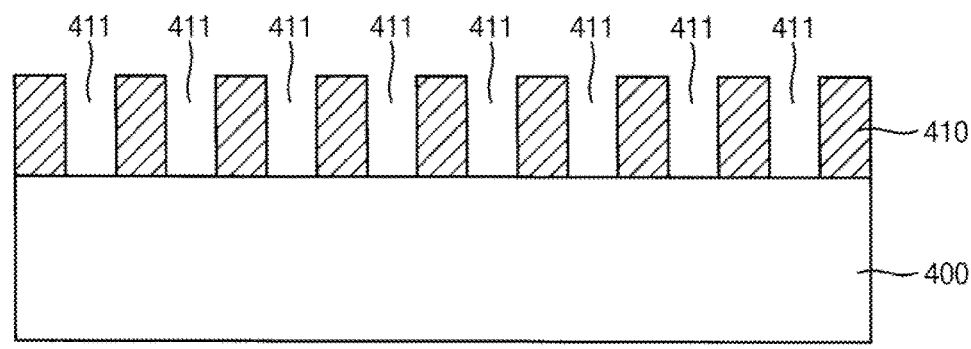

Referring to FIG. 30, trenches 411 may be formed by etching the sacrificial layer 415 and the ultra low dielectric layer 410 using the first through fourth mask patterns 421, 422, 423 and 424 as an etching mask. After that, the hard mask layer 420 and the sacrificial layer 415 may be removed.

Figure 31:
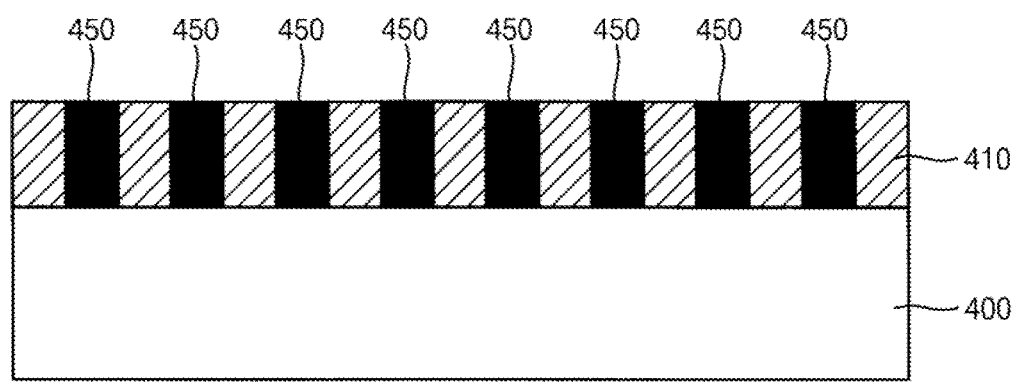

Referring to FIG. 31, a wiring pattern 450 may be formed by filling the trenches 411 with a metallic material.

A method of forming the wiring pattern 450 of a semiconductor device by performing a QPT process on the substrate 400 based on the first through fourth decomposed patterns DC_P1, DC_P2, DC_P3 and DC_P4 has been described above with reference to FIGS. 21 to 31 as an example. However, embodiments are not limited thereto, and a wiring pattern of a semiconductor device may be formed by performing various other types of QPT processes based on the first through fourth decomposed patterns DC_P1, DC_P2, DC_P3 and DC_P4.

Figure 32:
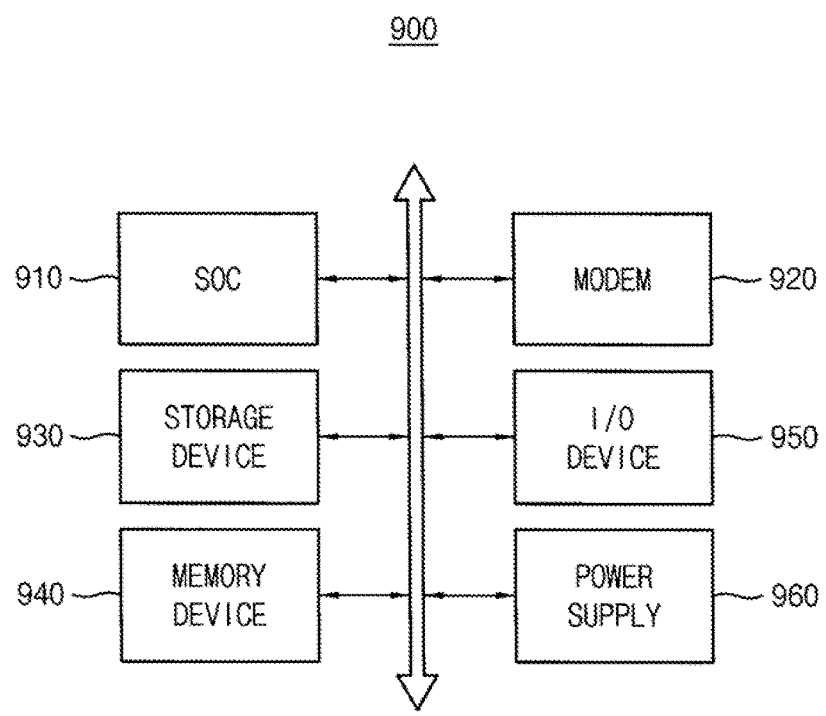
FIG. 32 is a block diagram that illustrates a computing system according to exemplary embodiments.

FIG. 32 is a block diagram that illustrates a computing system according to exemplary embodiments.

Referring to FIG. 32, a computing system 900 includes a system-on-chip SOC 910, a modem 920, a storage device 930, a memory device 940, an input/output device 950 and a power supply 960.

The system-on-chip 910 can control overall operations of the computing system 900.

The system-on-chip 910 may include various types of logic circuits. The system-on-chip 910 may be manufactured using a method of decomposing a layout of a semiconductor device for a QPT process of FIG. 1 and a method of manufacturing a semiconductor device of FIG. 20.

The modem 920 can communicate data with an external device through a wired or wireless communication.

The storage device 930 can store data received from the external device through the modem 920 and data to be transmitted to the external device through the modem 920. The storage device 930 may include a non-volatile memory device such as a flash memory device, a solid state drive (SSD), a hard disk drive (HDD), etc.

The memory device 940 can store data used by an operation of the computing system 900. The memory device 940 may include a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 950 may include a touch screen, a keypad, a keyboard, a mouse, a printer, a display, etc. The power supply 960 may supply an operational power.

In addition, the computing system 900 may further include ports that communicate with a video card, a sound card, a memory card, a universal serial bus (USB) device, or other electronic devices.

The system-on-chip 910 may communicate with the storage device 930, the memory device 940 and the input/output device 950 via an address bus, a control bus, and/or a data bus. In some exemplary embodiments, the system-on-chip 910 may be coupled to an extended bus, such as a peripheral component interconnection (PCI) bus.

The computing system 900 may be any computing system that includes the system-on-chip 910. For example, the computing system 900 may be a digital camera, a mobile phone, a smart phone, a laptop computer, a portable multimedia player (PMP), a personal digital assistant (PDA), etc.

The computing system 900 and/or components of the computing system 900 may be packaged in various forms, such as a package on package (PoP), a ball grid array (BGA), a chip scale package (CSP), a plastic leaded chip carrier (PLCC), a plastic dual in-line package (PDIP), a die in waffle pack, die in wafer form, a chip on board (COB), a ceramic dual in-line package (CERDIP), a plastic metric quad flat pack (MQFP), a thin quad flat pack (TQFP), a small outline IC (SOIC), a shrink small outline package (SSOP), a thin small outline package (TSOP), a system in package (SIP), a multi chip package (MCP), a wafer-level fabricated package (WFP), or a wafer-level processed stack package (WSP).

The foregoing is illustrative of embodiments of the present inventive concept and is not to be construed as limiting thereof. Although a few exemplary embodiments have been described, those skilled in the art will readily appreciate that many modifications are possible in the exemplary embodiments without materially departing from the novel teachings of embodiments of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of decomposing a layout of a semiconductor device for a quadruple patterning technology (QPT) process, comprising:

dividing the layout of the semiconductor device into a first temporary pattern, which includes rectangular features, and a second temporary pattern, which includes cross couple features;

generating a third temporary pattern and a fourth temporary pattern by performing a pattern dividing operation on the first temporary pattern in a first direction;

generating a first target pattern and a second target pattern by incorporating each of the cross couple features included in the second temporary pattern into one of the third temporary pattern and the fourth temporary pattern;

generating first through fourth decomposed patterns by performing the pattern dividing operation on the first target pattern and the second target pattern in a second direction, and forming first through fourth masks corresponding to the first through fourth decomposed patterns, respectively.

2. The method of claim 1, wherein the second direction is perpendicular to the first direction.

3. The method of claim 1, wherein the rectangular features have a rectangular shape, and the cross couple features have a Z-shape.

4. The method of claim 1, wherein each end of the cross couple features is within a critical dimension of at least two of the rectangular features.

5. The method of claim 1, wherein the pattern dividing operation is a double pattern dividing algorithm for a double patterning technology (DPT) process.

6. The method of claim 1, wherein generating the first target pattern and the second target pattern further includes:
generating a third target pattern by incorporating the cross couple features included in the second temporary pattern into the third temporary pattern;
generating a fifth temporary pattern and a sixth temporary pattern by performing the pattern dividing operation on the third target pattern in the second direction; and
determining whether a pattern conflict occurs in the fifth temporary pattern and the sixth temporary pattern.

7. The method of claim 6, further comprising, when a pattern conflict occurs:
identifying conflict cross couple features which cause a pattern conflict from among the cross couple features included in the fifth temporary pattern and the sixth temporary pattern;
generating the first target pattern by eliminating the conflict cross couple features from the third target pattern; and
generating the second target pattern by incorporating the conflict cross couple features into the fourth temporary pattern.

8. The method of claim 6, further comprising:
determining the third target pattern and the fourth temporary pattern as the first target pattern and the second target pattern, respectively, when no pattern conflict occurs in the fifth temporary pattern and the sixth temporary pattern.

9. The method of claim 1, wherein generating the first through fourth decomposed patterns further includes:
generating the first decomposed pattern and the second decomposed pattern by performing the pattern dividing operation on the first target pattern in the second direction; and
generating the third decomposed pattern and the fourth decomposed pattern by performing the pattern dividing operation on the second target pattern in the second direction.

10. The method of claim 1, wherein two rectangular features among the rectangular features included in the first temporary pattern, which are within a critical dimension from each other in the first direction, are separated into the third temporary pattern and the fourth temporary pattern.

11. The method of claim 1, wherein the first through fourth decomposed patterns are displayed with differing first through fourth colors, respectively.

12. The method of claim 1, wherein the semiconductor device corresponds to a system-on-chip.

13. A method of manufacturing a semiconductor device, comprising:
generating first through fourth decomposed patterns by performing a pattern dividing operation on a layout of the semiconductor device in a first direction and in a second direction using a double pattern dividing algorithm for a double patterning technology (DPT) process;
generating first through fourth masks corresponding to the first through fourth decomposed patterns, respectively;
forming a wiring pattern on a substrate by sequentially patterning the substrate using the first through fourth masks,
wherein the first direction is different from the second direction, and
wherein generating the first through fourth decomposed patterns includes:
dividing the layout of the semiconductor device into a first temporary pattern which includes rectangular features, and a second temporary pattern which includes cross couple features;
generating a third temporary pattern and a fourth temporary pattern by performing the pattern dividing operation on the first temporary patttern in the first direction;
generating a first target pattern and a second target pattern by incorporating each of the cross couple features included in the second temporary pattern into one of the third temporary pattern and the fourth temporary pattern; and
generating the first through fourth decomposed patterns by performing the pattern dividing operation on the first target pattern and the second target pattern in the second direction.

14. The method of claim 13, wherein generating the first through fourth decomposed patterns further includes:
generating the first decomposed pattern and the second decomposed pattern by performing the pattern dividing operation on the first target pattern in the second direction; and
generating the third decomposed pattern and the fourth decomposed pattern by performing the pattern dividing operation on the second target pattern in the second direction.

15. The method of claim 13, wherein the second direction is perpendicular to the first direction.

16. A layout decomposition device for a quadruple patterning technology (QPT) process, comprising:
a feature divider;
a controller in signal communication with the feature divider; and
a pattern decomposition device in signal communication with the controller, wherein
the feature divider receives a layout of a semiconductor device, divides the layout of the semiconductor device into a first temporary pattern which includes rectangular features and a second temporary pattern which includes cross couple features, and transmits the first temporary pattern and the second temporary pattern to the controller, wherein the controller and the pattern decomposition device repeat the steps of generating a target pattern, transmitting the target pattern and a direction signal to the pattern decomposition device, generating a first result pattern and a second result pattern from the target pattern using the direction signal, and transmitting the first result pattern and the second result pattern to the controller, to generate first through fourth decomposed patterns, and wherein said first through fourth decomposed patterns are used by a photolithography apparatus to manufacture first through fourth masks corresponding to the first through fourth decomposed patterns, respectively, wherein, the controller transmits the first temporary pattern and the direction signal representing a first direction to the pattern decomposition device, the pattern decomposition device generates the first result pattern and the second result pattern by performing a pattern dividing operation on the first temporary pattern in the first direction, wherein performing the pattern dividing operation comprises separating two rectangular features in the first temporary pattern that are within a critical dimension of each other in the first direction into the first result pattern and the second result pattern, and transmits the first result pattern and the second result pattern to the controller, the controller generates a first target pattern and a second target pattern based on the second temporary pattern, the first result pattern and the second result pattern by incorporating each of the cross couple features included in the second temporary pattern into one of the first result pattern and the second result pattern, transmits the first target pattern and the direction signal for a second direction to the pattern decomposition device, and transmits the second target pattern and the direction signal for the second direction to the pattern decomposition device, and the pattern decomposition device generates the first through fourth decomposed patterns by performing the pattern dividing operation on the first target pattern and the second target pattern in the second direction.

17. The layout decomposition device of claim 16, wherein the photolithography apparatus forms a wiring pattern on a substrate by sequentially patterning the substrate using the first through fourth masks.

18. The layout decomposition device of claim 16, wherein the pattern decomposition device generates the first through fourth decomposed patterns by performing a pattern dividing operation on the layout of the semiconductor device in the first direction and the second direction and the second direction is perpendicular to the first direction.

* * * * *